(12) United States Patent
Cho et al.

(10) Patent No.: US 10,409,722 B2
(45) Date of Patent: Sep. 10, 2019

(54) SYSTEM ON-CHIP AND ELECTRONIC DEVICE INCLUDING THE SAME

(71) Applicants: Kyong-Ho Cho, Seoul (KR); Ki-Soo Yu, Yongin-si (KR); Kyung-Il Sun, Suwon-si (KR)

(72) Inventors: Kyong-Ho Cho, Seoul (KR); Ki-Soo Yu, Yongin-si (KR); Kyung-Il Sun, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 37 days.

(21) Appl. No.: 14/995,804

(22) Filed: Jan. 14, 2016

(65) Prior Publication Data
US 2016/0299842 A1 Oct. 13, 2016

(30) Foreign Application Priority Data
Apr. 7, 2015 (KR) .................. 10-2015-0048921

(51) Int. Cl.
| | |
|---|---|
| *G06F 12/06* | (2006.01) |
| *G06F 13/16* | (2006.01) |
| *G11C 7/10* | (2006.01) |
| *G11C 7/20* | (2006.01) |
| *G11C 11/4072* | (2006.01) |
| *G06F 15/78* | (2006.01) |

(52) U.S. Cl.
CPC ...... *G06F 12/0607* (2013.01); *G06F 12/0653* (2013.01); *G06F 13/1647* (2013.01); *G06F 13/1668* (2013.01); *G06F 15/7857* (2013.01); *G11C 7/1072* (2013.01); *G11C 7/20* (2013.01); *G11C 11/4072* (2013.01); *G06F 2212/206* (2013.01); *G06F 2212/253* (2013.01); *Y02D 10/13* (2018.01); *Y02D 10/14* (2018.01)

(58) Field of Classification Search
CPC .................. G06F 12/0607; G06F 13/1668
See application file for complete search history.

(56) References Cited

U.S. PATENT DOCUMENTS

| | | | |
|---|---|---|---|
| 5,878,240 A * | 3/1999 | Tomko | ............. G06F 13/1657 710/316 |
| 6,029,210 A | 2/2000 | Yamazaki | |
| 6,857,041 B2 * | 2/2005 | LeClerg | ............. G06F 13/1668 711/103 |
| 7,296,110 B2 | 11/2007 | Chung et al. | |
| (Continued) | | | |

FOREIGN PATENT DOCUMENTS

| | | |
|---|---|---|
| JP | 1999-259356 A | 9/1999 |
| JP | 2001-175496 A | 6/2001 |

*Primary Examiner* — Charles Rones
*Assistant Examiner* — Tian-Pong Chang
(74) *Attorney, Agent, or Firm* — Volentine, Whitt & Francos, PLLC

(57) ABSTRACT

A system on-chip includes a central processing unit and a memory controller. The memory controller receives initialization information indicating an initialization address range and an initialization value from the central processing unit, determines an initialization target memory and a local initialization address range of the initialization target memory based on the initialization information, and transmits initialization data including the initialization value to the initialization target memory by a predetermined unit to initialize the local initialization address range of the initialization target memory.

3 Claims, 15 Drawing Sheets

(56) References Cited

U.S. PATENT DOCUMENTS

| | | | |
|---|---|---|---|
| 7,421,558 B2 | 9/2008 | Choi et al. | |
| 7,464,243 B2 | 12/2008 | Haridas et al. | |
| 8,006,032 B2 | 8/2011 | Askar et al. | |
| 8,756,395 B2 | 6/2014 | Barth et al. | |
| 2005/0216632 A1* | 9/2005 | Edirisooriya | G06F 13/362 710/113 |
| 2006/0007468 A1* | 1/2006 | Tanaka | G06F 1/32 358/1.14 |
| 2006/0020778 A1* | 1/2006 | Edrington | G06F 13/1694 713/1 |
| 2006/0265553 A1* | 11/2006 | Arimilli | G06F 12/0831 711/144 |
| 2008/0082741 A1* | 4/2008 | Biessener | G06F 3/0607 711/112 |
| 2009/0089515 A1* | 4/2009 | Michalak | G06F 13/1668 711/154 |
| 2010/0005227 A1* | 1/2010 | Nakanishi | G11C 16/20 711/103 |
| 2011/0214033 A1* | 9/2011 | Yoshii | G06F 11/1048 714/758 |
| 2013/0042047 A1 | 2/2013 | Nishio | |
| 2014/0337560 A1* | 11/2014 | Chun | G06F 12/0246 711/103 |

\* cited by examiner

SYSTEM ON-CHIP AND ELECTRONIC DEVICE INCLUDING THE SAME

CROSS-REFERENCE TO RELATED APPLICATION(S)

This application claims priority under 35 USC § 119 to Korean Patent Application No. 10-2015-0048921, filed on Apr. 7, 2015 in the Korean Intellectual Property Office (KIPO), the content of which are incorporated herein in its entirety by reference.

BACKGROUND

1. Technical Field

Example embodiments relate generally to a semiconductor device. More particularly, embodiments of the present disclosure relate to a system on-chip that controls a random access memory (e.g., a dynamic random access memory (DRAM), etc) and an electronic device including the system on-chip.

2. Description of the Related Art

Generally, a random access memory device includes a random access memory and a memory controller that controls the random access memory. Here, the memory controller may be implemented with a central processing unit (CPU) of an electronic device as a system on-chip. In the random access memory device, an initializing operation (e.g., a function such as memset( ), etc.) that initializes a specific address range of the random access memory with an initialization value (e.g., a binary digit '0' or a binary digit '1') is frequently performed. Conventionally, the initializing operation is performed in a way that the central processing unit repetitively transmits, by a specific unit (e.g., by a byte unit, by a word unit, by a cache-line unit, etc), initialization data including initialization values to the random access memory device via buses and the memory controller repetitively writes the received initialization data into the random access memory in the random access memory device. That is, since the initializing operation makes the central processing unit repetitively transmit the initialization data having the same pattern to the random access memory device via the buses, the initializing operation may unnecessarily increase bus traffic and/or a load of the central processing unit. As a result, performance degradation of the electronic device may occur.

SUMMARY

Some example embodiments provide a system on-chip that can initialize a specific address range (i.e., a local initialization address range) of an initialization target memory with an initialization value (e.g., a binary digit '0' or a binary digit '1') while minimizing (or, reducing) bus traffic and/or a load of a central processing unit.

Some example embodiments provide an electronic device including the system on-chip.

According to an aspect of example embodiments, a system on-chip may include at least one central processing unit and a memory controller that receives initialization information indicating an initialization address range and an initialization value from the central processing unit, determines at least one initialization target memory and at least one local initialization address range of the initialization target memory based on the initialization information, and transmits initialization data including the initialization value to the initialization target memory by a predetermined unit to initialize the local initialization address range of the initialization target memory.

In example embodiments, the predetermined unit may be set to be smaller than the local initialization address range. In addition, the memory controller repetitively may transmit the initialization data to the initialization target memory.

In example embodiments, the predetermined unit may be set to be equal to the local initialization address range. In addition, the memory controller may transmit the initialization data to the initialization target memory once.

In example embodiments, the memory controller may transmit an initialization completion signal to the central processing unit when the memory controller receives a local initialization completion signal from the initialization target memory as the local initialization address range of the initialization target memory is initialized.

In example embodiments, the central processing unit may initialize an internal cache when the central processing unit receives the initialization completion signal from the memory controller.

In example embodiments, the memory controller may stop processing an access request of an external device for the initialization address range when the memory controller receives the initialization information from the central processing unit.

In example embodiments, the memory controller may begin processing the access request when the memory controller receives a local initialization completion signal from the initialization target memory as the local initialization address range of the initialization target memory is initialized.

In example embodiments, the initialization data may be binary data, and the initialization value may be a binary digit '0' or a binary digit '1'.

In example embodiments, the initialization target memory may be a dynamic random access memory.

According to another aspect of example embodiments, a system on-chip may include at least one central processing unit and a traffic interleaver that receives initialization information indicating an initialization address range and an initialization value from the central processing unit, determines at least one initialization target memory and at least one local initialization address range of the initialization target memory based on the initialization information, and generates local initialization information indicating the local initialization address range and the initialization value of the initialization target memory. The system on-chip may further include a plurality of memory controllers that control a plurality of random access memory groups, each including at least one random access memory, receive the local initialization information from the traffic interleaver, and transmit, by a predetermined unit, initialization data including the initialization value to the initialization target memory based on the local initialization information to initialize the local initialization address range of the initialization target memory.

In example embodiments, the predetermined unit may be set to be smaller than the local initialization address range. In addition, each of the memory controllers may repetitively transmit the initialization data to the initialization target memory.

In example embodiments, the predetermined unit may be set to be equal to the local initialization address range. In addition, each of the memory controllers may transmit the initialization data to the initialization target memory once.

In example embodiments, the traffic interleaver may transmit an initialization completion signal to the central processing unit when the traffic interleaver receives a local initialization completion signal from the initialization target memory via the memory controllers as the local initialization address range of the initialization target memory is initialized.

In example embodiments, the central processing unit may initialize an internal cache when the central processing unit receives the initialization completion signal from the traffic interleaver.

In example embodiments, the traffic interleaver may stop processing an access request of an external device for the initialization address range when the traffic interleaver receives the initialization information from the central processing unit.

In example embodiments, the traffic interleaver may begin processing the access request when the traffic interleaver receives a local initialization completion signal from the initialization target memory via the memory controllers as the local initialization address range of the initialization target memory is initialized.

In example embodiments, the initialization data may be binary data, and the initialization value may be a binary digit '0' or a binary digit '1'.

In example embodiments, the initialization target memory may be a dynamic random access memory.

According to an aspect of example embodiments, an electronic device may include a random access memory device that receives initialization information indicating an initialization address range and an initialization value, determines at least one local initialization address range of at least one initialization target memory based on the initialization information, and transmits initialization data including the initialization value to the initialization target memory by a predetermined unit to initialize the local initialization address range of the initialization target memory. The electronic device may further include at least one central processing unit that controls the random access memory device and provides the random access memory device with the initialization information for initializing the initialization address range of the random access memory device.

In example embodiments, the predetermined unit may be set to be smaller than the local initialization address range. In addition, the initialization data may be repetitively transmitted to the initialization target memory.

In example embodiments, the predetermined unit may be set to be equal to the local initialization address range. In addition, the initialization data may be transmitted to the initialization target memory once.

In example embodiments, the random access memory device may transmit an initialization completion signal to the central processing unit when the local initialization address range of the initialization target memory is initialized.

In example embodiments, the central processing unit may initialize an internal cache when the central processing unit receives the initialization completion signal from the random access memory device.

In example embodiments, the random access memory device may stop processing an access request of the central processing unit for the initialization address range when the random access memory device receives the initialization information from the central processing unit.

In example embodiments, the random access memory device may begin processing the access request when the local initialization address range of the initialization target memory is initialized.

According to an aspect of example embodiments, a method of initializing memory that is executed by a memory controller includes receiving initialization information indicating an initialization address range and an initialization value from a processor; identifying, for each of a plurality of memory devices and from the initialization information indicating the initialization address range, a local address range to be initialized; and individually controlling each of the memory devices to write the initialization value into memory cells addressed by the local address range for the memory device.

In example embodiments, the memory controller controls each of the memory devices to write the initialization value into the memory cells addressed by the local address range by repetitively transmitting the initialization value to the memory device for writing in sub-ranges of the local address range.

In example embodiments, the memory controller controls each of the memory devices to write the initialization value into the memory cells addressed by the local address range by a single transmission of the initialization value for writing in the entirety of the local address range for the memory device.

In example embodiments, the memory controller receives, from each of the memory devices, a local initialization completion signal indicating the completion of writing the initialization value into the memory cells addressed by the local initialization address range of the memory device; and transmits an initialization completion signal to the processor upon receiving the local initialization completion signal from each of the memory devices.

In example embodiments, the memory controller receives, from an external device, an access request for an address within the initialization address range; and withholds processing of the access request upon receiving the initialization information, until the local initialization completion signal is received from each of the memory devices.

According to an aspect of example embodiments, a memory system includes a plurality of memory devices and a memory controller. The memory controller receives initialization information indicating an initialization address range and an initialization value from a processor; identifies, for each of the memory devices and from the initialization information indicating the initialization address range, a local address range to be initialized; and individually controls each of the memory devices to write the initialization value into memory cells addressed by the local address range for the memory device.

In example embodiments, the memory controller controls each of the memory devices to write the initialization value into the memory cells addressed by the local address range by repetitively transmitting the initialization value to the memory device for writing in sub-ranges of the local address range.

In example embodiments, the memory controller controls each of the memory devices to write the initialization value into the memory cells addressed by the local address range by a single transmission of the initialization value for writing in the entirety of the local address range for the memory device.

In example embodiments, the memory controller receives, from each of the memory devices, a local initialization completion signal indicating the completion of writing the initialization value into the memory cells addressed by the local initialization address range of the memory device; and transmits an initialization completion signal to the processor upon receiving the local initialization completion signal from each of the memory devices.

In example embodiments, the memory controller receives, from an external device, an access request for an address within the initialization address range; and withholds processing of the access request upon receiving the initialization information, until the local initialization completion signal is received from each of the memory devices.

Therefore, a system on-chip according to example embodiments may initialize a local initialization address range of an initialization target memory in a way that a memory controller determines the local initialization address range of the initialization target memory based on initialization information indicating an initialization address range and an initialization value and transmits, by a predetermined unit, initialization data including the initialization value (e.g., a binary digit '0' or a binary digit '1') to the initialization target memory as a central processing unit provides the initialization information to the memory controller. Thus, the system on-chip may prevent bus traffic and/or a load of the central processing unit from being unnecessarily increased when performing an initializing operation on the initialization target memory.

In addition, an electronic device according to example embodiments may include the random access memory device. Thus, even when an initializing operation is performed on an initialization target memory in the random access memory device, the electronic device may enable an interaction between a central processing unit and a function device (e.g., another central processing unit, a display device, a communication device, a sensor device, a storage device, an input/output (I/O) device, etc.) and may secure a sufficient bus bandwidth that can be used by the central processing unit and the function device.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
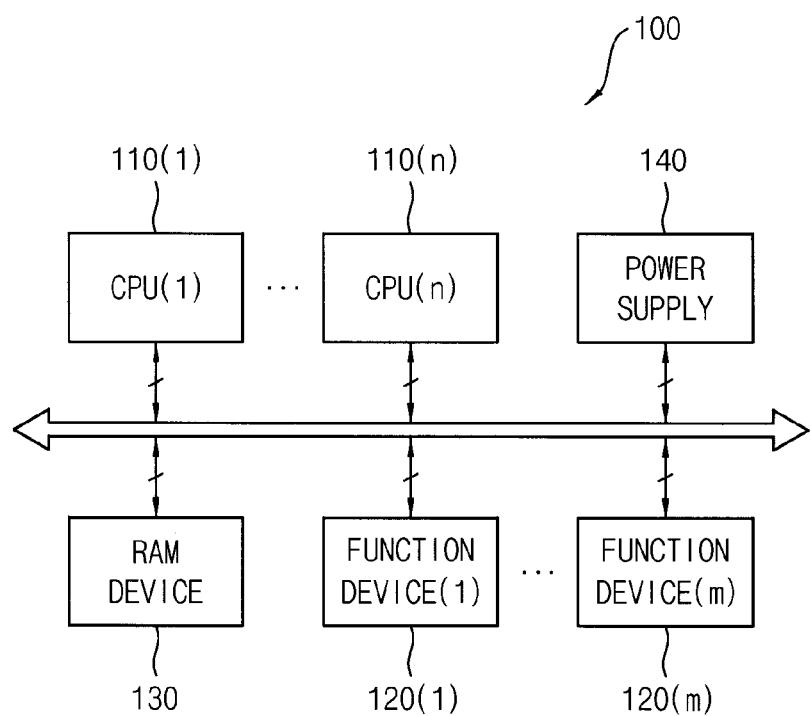
FIG. 1 is a block diagram illustrating an electronic device according to example embodiments.

Various example embodiments will be described more fully with reference to the accompanying drawings, in which some example embodiments are shown. The present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
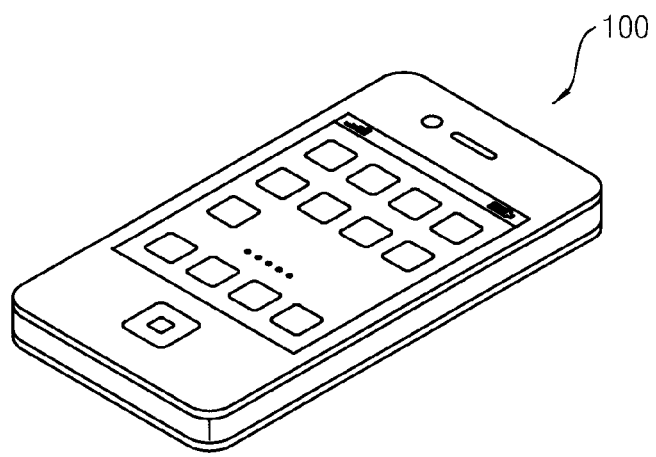
FIG. 2 is a diagram illustrating an example in which the electronic device of FIG. 1 is implemented as a smart phone.
Figure 3:
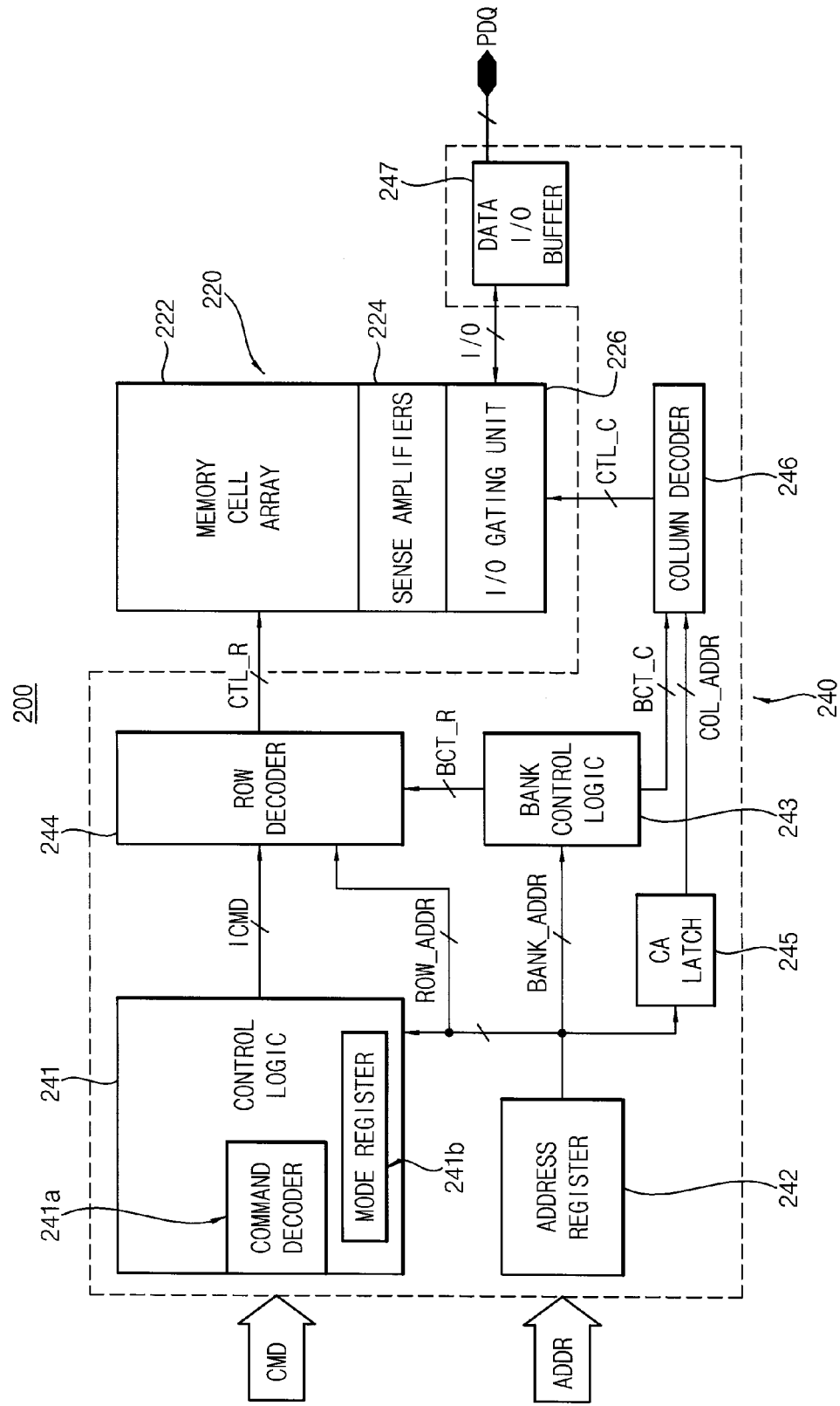
FIG. 3 is a block diagram illustrating an example of a random access memory included in a random access memory device of the electronic device of FIG. 1.

FIG. 1 is a block diagram illustrating an electronic device according to example embodiments. FIG. 2 is a diagram illustrating an example in which the electronic device of FIG. 1 is implemented as a smart phone. FIG. 3 is a block diagram illustrating an example of a random access memory included in a random access memory device of the electronic device of FIG. 1.

Referring to FIGS. 1 through 3, the electronic device 100 may include a central processing unit 110(1) through 110(n), where n is an integer greater than or equal to 1, a function device 120(1) through 120(m), where m is an integer greater than or equal to 1, a random access memory device 130, a power supply 140, etc. In an example embodiment, as illustrated in FIG. 2, the electronic device 100 may be implemented as a smart phone. However, the electronic device 100 is not limited thereto. For example, the electronic device 100 may be implemented as a cellular phone, a video phone, a smart pad, a tablet PC, a car navigation system, a computer monitor, a laptop, a head mounted display (HMD), etc.

The central processing unit 110(1) through 110(n) may control the function device 120(1) through 120(m) and the random access memory device 130. The central processing unit 110(1) through 110(n) may perform various calculations and tasks. In some example embodiments, the central processing unit 110(1) through 110(n) may be a micro-processor, an application processor (AP), etc. The central processing unit 110(1) through 110(n) may be connected to other components via an address bus, a control bus, a data bus, etc. In some example embodiments, the central processing unit 110(1) through 110(n) may be connected to an extended bus such as a peripheral component interconnection (PCI) bus. The central processing unit 110(1) through 110(n) may provide the random access memory device 130 with initialization information for initializing an initialization address range of the random access memory device 130 (i.e., for writing an initialization value into the initialization address range of the random access memory device 130). For example, when a software component, etc that drives the electronic device 100 requires initializing a specific address range of the random access memory device 130 with the initialization value, the central processing unit 110(1) through 110(n) may provide the random access memory device 130 with the initialization information for initializing the specific address range (i.e., the initialization address range) of the random access memory device 130. Here, initialization data including the initialization values may be binary data, and the initialization value may be a binary digit '0' or a binary digit '1'. As described above, in a conventional electronic device, an initializing operation is performed on the random access memory (i.e., the specific address range of the random access memory is initialized with the initialization value) in a way that the central processing unit 110(1) through 110(n) repetitively transmits, by a specific unit (e.g., by a byte unit, by a word unit, by a cache-line unit, etc), the initialization data including the initialization values to the random access memory device 130 via buses and the memory controller repetitively writes the received initialization data into the random access memory in the random access memory device 130. That is, since the central processing unit 110(1) through 110(n) repetitively transmits the initialization data having the same pattern to the random access memory device 130 via the buses, bus traffic and/or a load of the central processing unit 110(1) through 110(n) may be unnecessarily increased in the conventional electronic device. To overcome this problem, in the electronic device 100, the central processing unit 110(1) through 110(n) may provide the random access memory device 130 with only initialization information for initializing the initialization address range of the random access memory device 130. That is, in the electronic device 100, the central processing unit 110(1) through 110(n) may not perform an operation of a central processing unit included in the conventional electronic device that repetitively transmits the initialization data having the same pattern to the random access memory device 130 via the buses. Although it is illustrated in FIG. 1 that the first through (n)th central processing units 110(1) through 110(n) are separate components, in some example embodiments, the first through (n)th central processing units 110(1) through 110(n) may be interpreted as a plurality of cores 110(1) through 110(n) of one central processing unit.

The function device 120(1) through 120(m) may perform various functions (e.g., a communication function, a camera function, etc). The function device 120(1) through 120(m) may correspond to intellectual property (IP) included in the electronic device 100. An operation of the function device 120(1) through 120(m) may be controlled by the central processing unit 110(1) through 110(n). Here, the function device 120(1) through 120(m) may include a display device, a communication device, a sensor device, a storage device, an I/O device, etc. The display device may perform a display function (i.e., may provide visual information to a user). For example, the display device may include a liquid crystal display device, an organic light emitting display device, etc. The communication device may perform a communication function (i.e., may receive data from an external component and may transmit internally generated data to an external component). For example, the communication device may include a global system for mobile communication (GSM) device, a general packet radio service (GPRS) device, a code division multiple access (CDMA) device, a long term evolution (LTE) device, a radio frequency (RF) device, an ultra wideband (UWB) device, a wireless local area network (WLAN) device, a worldwide interoperability for microwave access (WIMAX) device, etc. The sensor device may perform a sensing function. For example, the sensor device may include a gyro sensor device that measures a rotating angular speed, an acceleration sensor device that measures speed and momentum, a geomagnetic field sensor device that acts as a compass, a barometer sensor device that measures altitude, a gesture-proximity-illumination-RGB sensor device that performs various operations such as motion recognition, proximity detection, an illumination measurement, etc, a temperature-humidity sensor device that measures temperature and humidity, and a grip sensor device that determines whether an electronic device is gripped by a user, etc. The storage device may include a solid state drive (SSD) device, a hard disk drive (HDD)

device, a CD-ROM device, etc. The I/O device may include an input device such as a keyboard, a keypad, a touchpad, a touch-screen, a mouse device, etc, and an output device such as a printer, a speaker, etc. However, the function device 120(1) through 120(m) is not limited thereto. For example, the function device 120(1) through 120(m) may further include a global positioning system (GPS) device, a microphone (MIC) device, a camera device, etc. The power supply 140 may provide power for the operation of the electronic device 100.

The random access memory device 130 may initialize the local initialization address range of the initialization target memory (i.e., may write the initialization value into the local initialization address range of the initialization target memory by receiving the initialization information indicating the initialization address range and the initialization value from the central processing unit 110(1) through 110(n)), by determining the local initialization address range of the initialization target memory based on the initialization information indicating the initialization address range and the initialization value, and by transmitting the initialization data including the initialization values to the initialization target memory by a predetermined unit. Generally, when the random access memory device 130 includes one or more random access memories, physical addresses of the random access memory device 130 recognized by the central processing unit 110(1) through 110(n) may be dispersedly mapped to physical addresses of one ore more random access memories included in the random access memory device 130. For example, when the random access memories included in the random access memory device 130 are connected (or, organized) to form a redundant array inexpensive disks (RAID) structure, consecutive physical addresses of the random access memory device 130 recognized by the central processing unit 110(1) through 110(n) may be dispersed to physical addresses of the random access memories included in the random access memory device 130. Thus, the initialization address range of the random access memory device 130 recognized by the central processing unit 110(1) through 110(n) may be dispersedly mapped to one or more local initialization address ranges of one or more random access memories included in the random access memory device 130. Therefore, when the random access memory device 130 receives the initialization information indicating the initialization address range and the initialization value from the central processing unit 110(1) through 110(n), the random access memory device 130 may initialize the local initialization address range of the initialization target memory by determining an initialization target memory and its local initialization address range corresponding to the initialization address range among the random access memories included in the random access memory device 130 and by transmitting the initialization data including the initialization values to the initialization target memory by a predetermined unit.

In an example embodiment, the predetermined unit by which the initialization data is transmitted may be set to be smaller than the local initialization address range of the initialization target memory. In this case, the initialization data is required to be repetitively transmitted to the initialization target memory because the local initialization address range of the initialization target memory cannot be completely written (or, initialized) with the initialization value when the initialization data is transmitted only once. In another example embodiment, the predetermined unit by which the initialization data is transmitted may be set to be equal to the local initialization address range of the initialization target memory. In this case, the initialization data is required to be transmitted to the initialization target memory once because the local initialization address range of the initialization target memory can be completely written with the initialization value when the initialization data is transmitted only once. In some example embodiments, when the local initialization address range of the initialization target memory is initialized (if a plurality of initialization target memories exists, all local initialization address ranges of the initialization target memories are initialized), the random access memory device 130 may transmit an initialization completion signal to the central processing unit 110(1) through 110(n). In addition, when the central processing unit 110(1) through 110(n) receives the initialization completion signal from the random access memory device 130, the central processing unit 110(1) through 110(n) may initialize its internal cache. That is, since data stored in the internal cache is no longer valid after the local initialization address range of the initialization target memory is initialized (if a plurality of initialization target memories exists, all local initialization address ranges of the initialization target memories are initialized), the central processing unit 110(1) through 110(n) may initialize the internal cache. In some example embodiments, when the random access memory device 130 receives the initialization information from the central processing unit 110(1) through 110(n), the random access memory device 130 may stop (or, postpone) processing an access request of the function device 120(1) through 120(m) and/or an access request of another central processing unit 110(1) through 110(n) that does not interact with the random access memory device 130 for the initialization address range. Subsequently, when the local initialization address range of the initialization target memory is initialized (if a plurality of initialization target memories exists, all local initialization address ranges of the initialization target memories are initialized), the random access memory device 130 may begin (or, restart) processing the access request of the function device 120(1) through 120(m) and/or the access request of another central processing unit 110(1) through 110(n) that does not interact with the random access memory device 130 for the initialization address range. In brief, while the initializing operation is performed in the random access memory device 130, the function device 120(1) through 120(m) and/or another central processing unit 110(1) through 110(n) that does not interact with the random access memory device 130 may not be allowed to access the initialization address range.

As described above, the random access memory device 130 may initialize the local initialization address range of the initialization target memory by determining the local initialization address range of the initialization target memory based on the initialization information received from the central processing unit 110(1) through 110(n) and by transmitting the initialization data including the initialization values to the initialization target memory by the predetermined unit. In an example embodiment, the random access memory device 130 may include one or more random access memories and a memory controller that controls the random access memories. In this case, the memory controller may initialize a local initialization address range of an initialization target memory by receiving initialization information indicating an initialization address range and an initialization value from the central processing unit 110(1) through 110(n), by determining an initialization target memory and its local initialization address range based on the initialization information indicating the initialization address range and the initialization value, and by transmitting initialization data including the initialization values to the initialization target memory by a predetermined unit. In another example embodiment, the random access memory device 130 may include a plurality of random access memory groups, a plurality of memory controllers for respective random access memory groups, and a traffic interleaver. Here, each of the random access memory groups may include one or more random access memories. In addition, each of the memory controllers may control each of the random access memory groups. In this case, each of the memory controllers may initialize a local initialization address range of an initialization target memory by receiving local initialization information indicating the local initialization address range of the initialization target memory and an initialization value from the traffic interleaver and by transmitting, by a predetermined unit, initialization data including the initialization values to the initialization target memory based on the local initialization information. The traffic interleaver may receive initialization information indicating an initialization address range and the initialization value from the central processing unit 110(1) through 110(n), may determine the initialization target memory and its local initialization address range based on the initialization information indicating the initialization address range and the initialization value, may generate the local initialization information indicating the local initialization address range of the initialization target memory and the initialization value, and then may provide the memory controllers with the local initialization information indicating the local initialization address range of the initialization target memory and the initialization value. These operations will be described in detail with reference to FIGS. 4 through 15.

In an example embodiment, the random access memory device 130 may be a dynamic random access memory (DRAM) device. In this case, the random access memory device 130 may include a dynamic random access memory 200. For example, as illustrated in FIG. 3, the dynamic random access memory 200 may include a memory region 220 and a peripheral region 240. The memory region 220 may include a memory cell array 222, sense amplifiers 224, and an I/O gating unit 226. Based on a row control signal CTL_R provided from a row decoder 244 and a column control signal CTL_C provided from a column decoder 246, the memory cell array 222 may write data into internal volatile memory cells or may read data stored in the internal volatile memory cells. The sense amplifiers 224 may perform a write operation by applying data input from an external component into the memory cell array 222 and may perform a read operation by sensing data stored in the memory cell array 222. The I/O gating unit 226 may perform a gating operation for data input from an external component and data stored in the memory cell array 222 when the dynamic random access memory 200 performs the write operation or the read operation. The peripheral region 240 may include a control logic 241, an address register 242, a bank control logic 243, the row decoder 244, a column address latch 245, the column decoder 246, and a data I/O buffer 247. The control logic 241 may control an overall operation of the dynamic random access memory 200. For example, the control logic 241 may generate an internal control signal ICMD for the write operation and the read operation of the dynamic random access memory 200. In some example embodiments, the control logic 241 may include a command decoder 241a that decodes a command CMD input from an external component and a mode register 241b that sets an operation mode of the dynamic random access memory 200. For example, the command decoder 241a may generate the internal control signal ICMD corresponding to a command CMD by decoding a write enable signal /WE, a row address strobe signal /RAS, a column address strobe signal /CAS, a chip selection signal /CS, etc. Meanwhile, the control logic 241 may further receive a clock signal CLK and a clock enable signal /CKE for driving the dynamic random access memory 200 by a synchronous method.

Further, the control logic 241 may control a refresh operation of the dynamic random access memory 200 in response to a refresh command REF. The address register 242 may receive an address ADDR including a bank address BANK_ADDR, a row address ROW_ADDR, and a column address COL_ADDR from an external component. The address register 242 may provide the bank address BANK_ADDR to the bank control logic 243, may provide the row address ROW_ADDR to the row decoder 244, and may provide the column address COL_ADDR to the column decoder 246 through the column address latch 245. The bank control logic 243 may generate a first bank control signal BCT_R and a second bank control signal BCT_C in response to the bank address BANK_ADDR. For example, when the memory cell array 222 includes a plurality of bank arrays, a bank row decoder corresponding to the bank address BANK_ADDR among a plurality of bank row decoders included in the row decoder 244 may be activated in response to the first bank control signal BCT_R, and a bank column decoder corresponding to the bank address BANK_ADDR among a plurality of bank column decoders included in the column decoder 246 may be activated in response to the second bank control signal BCT_C. The row decoder 244 may decode the row address ROW_ADDR to activate a word-line corresponding to the row address ROW_ADDR. For example, the row decoder 244 may apply a word-line driving voltage to a word-line corresponding to the row address ROW_ADDR. The column address latch 245 may receive the column address COL_ADDR from the address register 242 to temporarily store the column address COL_ADDR and may provide the column address COL_ADDR to the column decoder 246. In some example embodiments, the column address latch 242 may gradually increase the column address COL_ADDR in a burst mode. The column decoder 246 may activate one or more sense amplifiers corresponding to the bank address BANK_ADDR and the column address COL_ADDR through the I/O gating unit 226. The data I/O buffer 247 may perform a buffer operation for input data and output data (i.e., I/O data). Since this structure is an example, a structure of the dynamic random access memory 200 is not limited to a structure illustrated in FIG. 3.

As described above, the random access memory device 130 may initialize the local initialization address range of the initialization target memory by receiving the initialization information indicating the initialization address range and the initialization value from the central processing unit 110(1) through 110(n), by determining the local initialization address range of the initialization target memory based on the initialization information indicating the initialization address range and the initialization value, and by transmitting the initialization data including the initialization values (e.g., a binary digit '0' or a binary digit '1') to the initialization target memory by a predetermined unit. In addition, the random access memory device 130 may transmit the initialization completion signal to the central processing unit 110(1) through 110(n) when the local initialization address range of the initialization target memory is initialized (if a plurality of initialization target memories exists, all local initialization address ranges of the initialization target memories are initialized). In this way, the random access memory device 130 may perform the initializing operation on the initialization target memory (i.e., may write the initialization value into the local initialization address range of the initialization target memory). As a result, the random access memory device 130 may prevent the bus traffic and/or the load of the central processing unit 110(1) through 110(n) from being unnecessarily increased when performing the initializing operation on the initialization target memory. Thus, even when the initializing operation is performed on the initialization target memory in the random access memory device 130, the electronic device 100 including the random access memory device 130 may enable an interaction between the central processing unit 110(1) through 110(n) and the function device 120(1) through 120(m) (e.g., another central processing unit, a display device, a communication device, a sensor device, a storage device, an I/O device, etc) and may secure a sufficient bus bandwidth that can be used by the central processing unit 110(1) through 110(n) and the function device 120(1) through 120(m). For example, the electronic device 100 may be implemented by various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat-Pack (TQFP), Small Outline Integrated Circuit (SOIC), Shrink Small Outline Package (SSOP), Thin Small Outline Package (TSOP), Thin Quad Flat-Pack (TQFP), System In Package (SIP), Multi Chip Package (MCP), Wafer-level Fabricated Package (WFP), and Wafer-Level Processed Stack Package (WSP).

Figure 4:
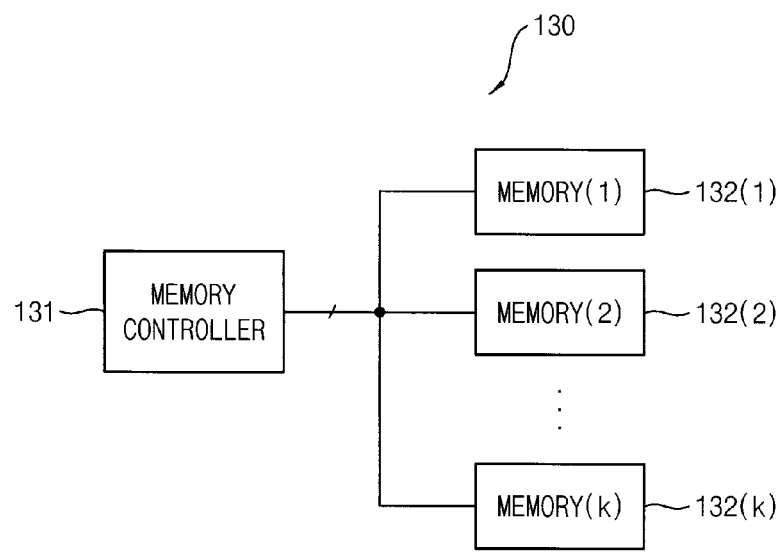
FIG. 4 is a block diagram illustrating a random access memory device according to example embodiments.
Figure 5:
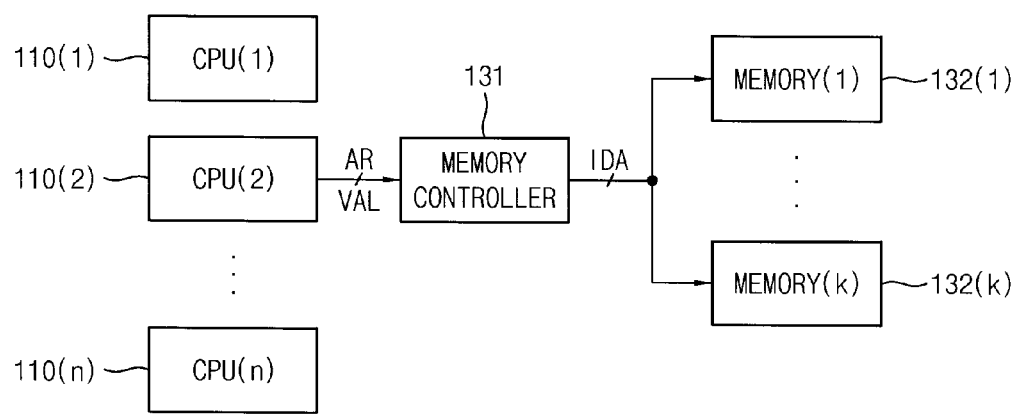
FIG. 5 is a block diagram illustrating a system on-chip according to example embodiments.
Figure 6:
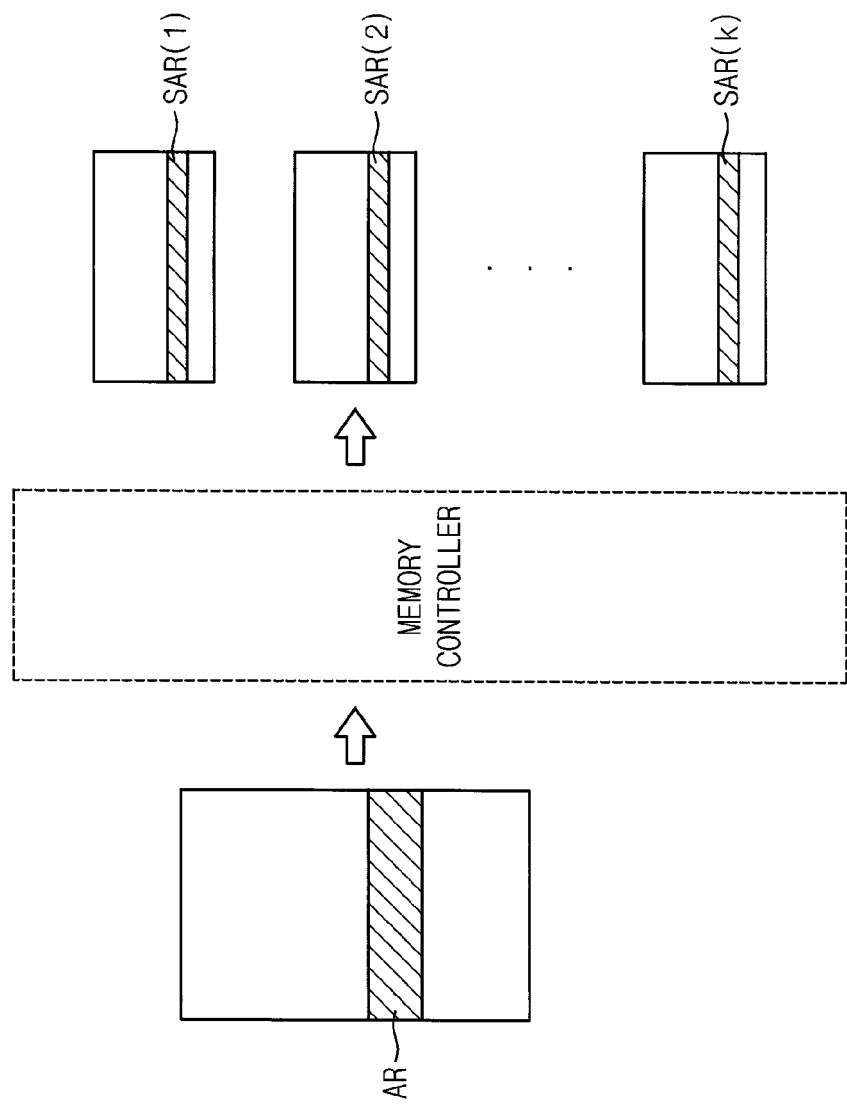
FIG. 6 is a diagram for describing an initializing operation that is performed on an initialization target memory by the system on-chip of FIG. 5.

FIG. 4 is a block diagram illustrating a random access memory device according to example embodiments. FIG. 5 is a block diagram illustrating a system on-chip according to example embodiments. FIG. 6 is a diagram for describing an initializing operation that is performed on an initialization target memory by the system on-chip of FIG. 5.

Referring to FIGS. 4 through 6, the random access memory device 130 may include a memory controller 131 and a plurality of random access memories 132(1) through 132(k), where k is an integer greater than or equal to 2. Here, the memory controller 131 may be implemented with the central processing unit 110(1) through 110(n) of the electronic device as the system on-chip. As illustrated in FIG. 5, the random access memory device 130 may interact with the central processing unit 110(1) through 110(n). Although it is illustrated in FIG. 5 that the random access memory device 130 interacts with the central processing unit 110(2), the central processing unit 110(1) through 110(n) which the random access memory device 130 interacts with may be changed in real-time. For example, the random access memory device 130 may interact with one of the central processing units 110(1) through 110(n). Meanwhile, it is assumed in FIGS. 4 through 6 that a plurality of local initialization address ranges SAR(1) through SAR(k) exists.

The random access memories 132(1) through 132(k) may store data for operations of the electronic device. Here, when a software component, etc., that drives the electronic device requires initializing a specific address range (i.e., an initialization address range AR) of the random access memory device 130 with an initialization value VAL, the local initialization address ranges SAR(1) through SAR(k) of the random access memories 132(1) through 132(k) corresponding to the initialization address range AR of the random access memory device 130 may be initialized. That is, as illustrated in FIG. 6, the physical addresses of the random access memory device 130 recognized by the central processing unit 110(1) through 110(n) may be dispersedly mapped to the physical addresses of the random access memories 132(1) through 132(k) included in the random access memory device 130. Thus, the initialization address range AR of the random access memory device 130 recognized by the central processing unit 110(1) through 110(n) may be dispersedly mapped to the local initialization address ranges SAR(1) through SAR(k) of the random access memories 132(1) through 132(k) included in the random access memory device 130. Therefore, when initializing the initialization address range AR of the random access memory device 130 with the initialization value VAL is required, the local initialization address ranges SAR(1) through SAR(k) of the random access memories 132(1) through 132(k) corresponding to the initialization address range AR of the random access memory device 130 may be initialized. In an example embodiment, the random access memories 132(1) through 132(k) may be dynamic random access memories. However, the random access memories 132(1) through 132(k) are not limited thereto. For example, the random access memories 132(1) through 132(k) may be static random access memories (SRAM), mobile dynamic random access memories, etc.

The memory controller 131 may receive the initialization information indicating the initialization address range AR and the initialization value VAL from the central processing unit 110(1) through 110(n), may determine the initialization target memories 132(1) through 132(k) and their local initialization address ranges SAR(1) through SAR(k) corresponding to the initialization address range AR among the random access memories 132(1) through 132(k) included in the random access memory device 130, and may transmit initialization data IDA including the initialization values VAL to the initialization target memories 132(1) through 132(k) by a predetermined unit. In this way, the memory controller 131 may initialize the local initialization address ranges SAR(1) through SAR(k) of the initialization target memories 132(1) through 132(k). Here, the initialization data IDA may be binary data, and the initialization value VAL may be a binary digit '0' or a binary digit '1'. In addition, the memory controller 131 may provide a command for writing the initialization data IDA into the local initialization address ranges SAR(1) through SAR(k) when transmitting the initialization data IDA to the initialization target memories 132(1) through 132(k). In an example embodiment, the predetermined unit by which the initialization data IDA is transmitted may be set to be smaller than each of the local initialization address ranges SAR(1) through SAR(k) of the initialization target memories 132(1) through 132(k). In this case, the initialization data IDA may be repetitively transmitted to each of the initialization target memories 132(1) through 132(k) because the local initialization address ranges SAR(1) through SAR(k) of the initialization target memories 132(1) through 132(k) cannot be completely initialized with the initialization value VAL when the initialization data IDA is transmitted only once. For example, the predetermined unit may be a byte unit, a word unit, etc. In another example embodiment, the predetermined unit by which the initialization data IDA is transmitted may be set to be equal to each of the local initialization address ranges SAR(1) through SAR(k) of the initialization target memories 132(1) through 132(k). In this case, the initialization data IDA may be transmitted to each of the initialization target memories 132(1) through 132(k)

once because each of the local initialization address ranges SAR(1) through SAR(k) of the initialization target memories 132(1) through 132(k) can be completely written with the initialization value VAL when the initialization data IDA is transmitted only once. For example, the predetermined unit may be not fixed for the initialization target memories 132(1) through 132(k). In other words, the predetermined unit may be changed according to the local initialization address ranges SAR(1) through SAR(k) for the initialization target memories 132(1) through 132(k).

In example embodiments, when the local initialization address ranges SAR(1) through SAR(k) of the initialization target memories 132(1) through 132(k) are initialized (i.e., the local initialization address ranges SAR(1) through SAR(k) of the initialization target memories 132(1) through 132(k) are written with the initialization value VAL), each of the initialization target memories 132(1) through 132(k) may transmit a local initialization completion signal to the memory controller 131. For example, the initialization target memory 132(1) may transmit the local initialization completion signal to the memory controller 131 when the local initialization address range SAR(1) of the initialization target memory 132(1) is initialized, the initialization target memory 132(2) may transmit the local initialization completion signal to the memory controller 131 when the local initialization address range SAR(2) of the initialization target memory 132(2) is initialized, and the initialization target memory 132(k) may transmit the local initialization completion signal to the memory controller 131 when the local initialization address range SAR(k) of the initialization target memory 132(k) is initialized. Subsequently, when the memory controller 131 receives all local initialization completion signals from the initialization target memories 132(1) through 132(k), the memory controller 131 may transmit an initialization completion signal to the central processing unit 110(1) through 110(n). For example, if k initialization target memories 132(1) through 132(k) exist, the memory controller 131 may transmit the initialization completion signal to the central processing unit 110(1) through 110(n) after receiving all local initialization completion signals from the k initialization target memories 132(1) through 132(k). In example embodiments, when the memory controller 131 receives the initialization information indicating the initialization address range AR and the initialization value VAL from the central processing unit 110(1) through 110(n), the memory controller 131 may stop (or, postpone) processing an access request of an external device for the initialization address range AR. For example, the external device may be the function device 120(1) through 120(m) and/or another central processing unit 110(1) through 110(n) that does not interact with the random access memory device 130. Subsequently, when the memory controller 131 receives all local initialization completion signals from the initialization target memories 132(1) through 132(k) (i.e., the local initialization address ranges SAR(1) through SAR(k) of the initialization target memories 132(1) through 132(k) are all initialized), the memory controller 131 may begin (or, restart) processing the access request of the function device 120(1) through 120(m) and/or the access request of another central processing unit 110(1) through 110(n) that does not interact with the random access memory device 130 for the initialization address range AR. In brief, while the initializing operation is performed in the random access memory device 130, the function device 120(1) through 120(m) and/or another central processing unit 110(1) through 110(n) that does not interact with the random access memory device 130 may not be allowed to access the initialization address range AR.

As described above, the memory controller 131 may initialize the local initialization address ranges SAR(1) through SAR(k) of the initialization target memories 132(1) through 132(k) by receiving the initialization information indicating the initialization address range AR and the initialization value VAL from the central processing unit 110(1) through 110(n), by determining the local initialization address ranges SAR(1) through SAR(k) of the initialization target memories 132(1) through 132(k) based on the initialization information indicating the initialization address range AR and the initialization value VAL, and by transmitting the initialization data IDA including the initialization values VAL to the initialization target memories 132(1) through 132(k) by a predetermined unit. In addition, the memory controller 131 may transmit the initialization completion signal to the central processing unit 110(1) through 110(n) when the local initialization address ranges SAR(1) through SAR(k) of the initialization target memories 132(1) through 132(k) are all initialized. In this way, the memory controller 131 may perform the initializing operation on the initialization target memories 132(1) through 132(k). As a result, the system on-chip including the central processing unit 110(1) through 110(n) and the memory controller 131 may prevent the bus traffic and/or the load of the central processing unit 110(1) through 110(n) from being unnecessarily increased when performing the initializing operation on the initialization target memories 132(1) through 132(k). In other words, since the memory controller 131 leadingly performs an initializing operation (e.g., a function such as memset( ), etc.,) that a conventional electronic device frequently performs to repetitively write the same value into a specific address range, the system on-chip including the central processing unit 110(1) through 110(n) and the memory controller 131 may reduce the bus traffic and/or the load of the central processing unit 110(1) through 110(n) and thus may increase a bus bandwidth that can be used by the function device 120(1) through 120(m) and the central processing unit 110(1) through 110(n). As a result, the electronic device including the random access memory device 130 may achieve improved reliability, improved performance, and consumption power reduction.

Figure 7:
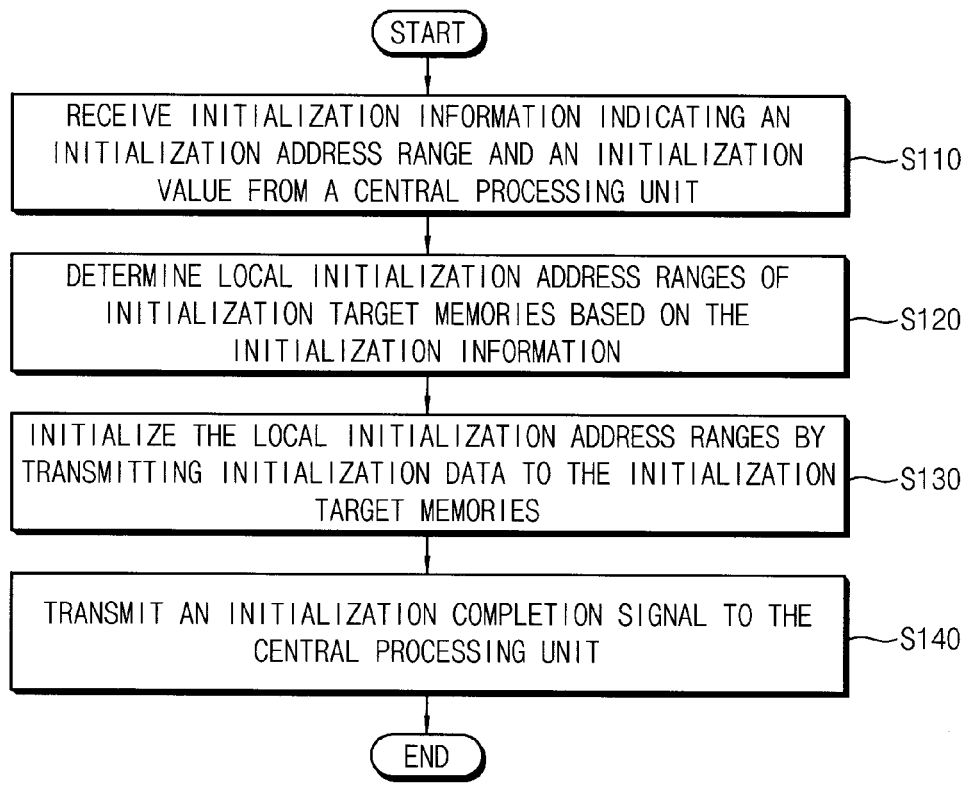
FIG. 7 is a flowchart illustrating an example in which a memory controller included in the system on-chip of FIG. 5 operates.
Figure 8:
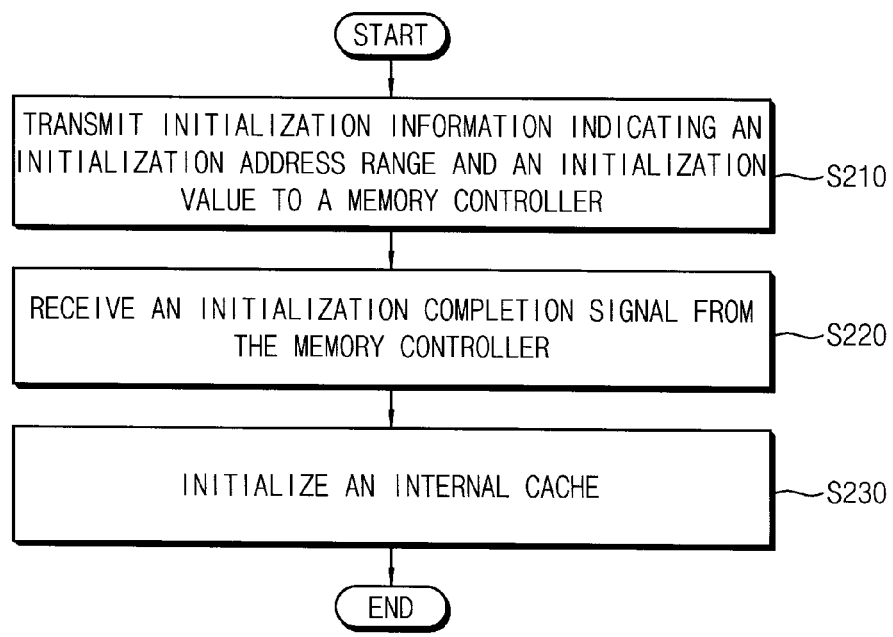
FIG. 8 is a flowchart illustrating an example in which a central processing unit included in the system on-chip of FIG. 5 operates.
Figure 9:
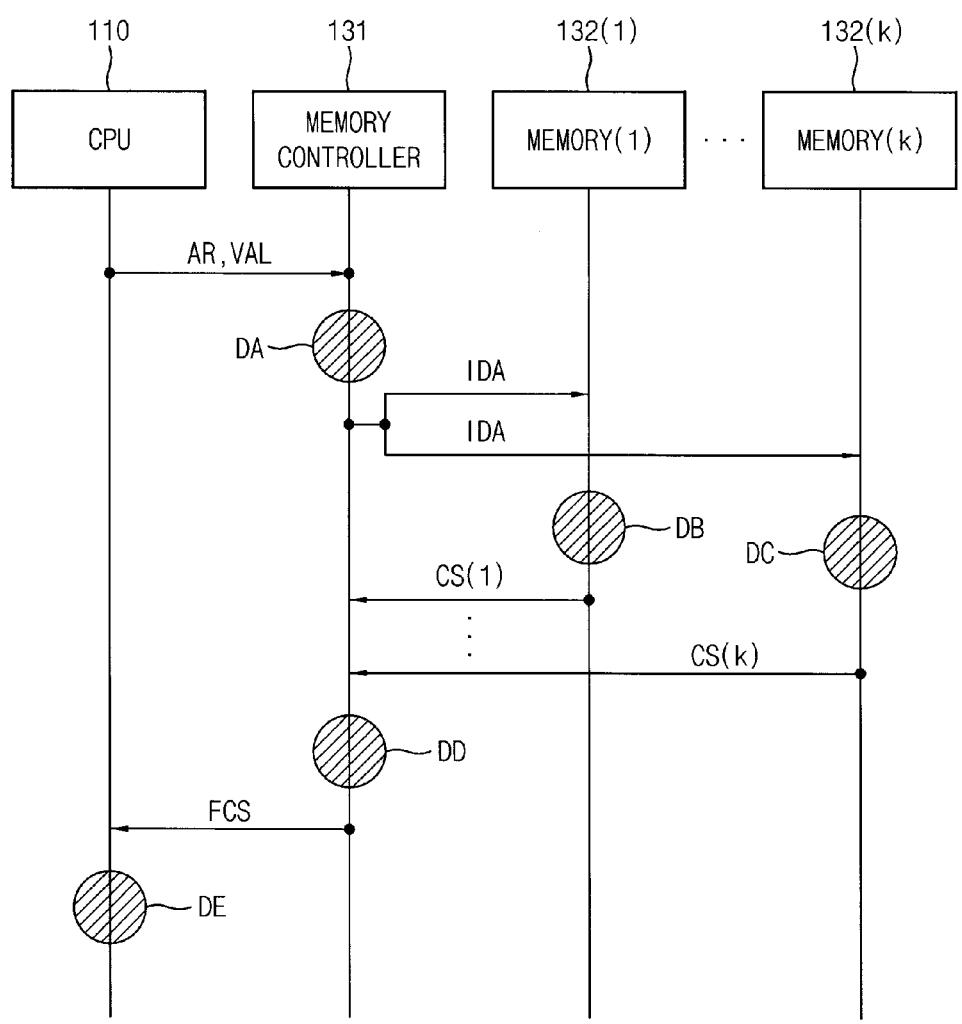
FIG. 9 is a diagram illustrating an example in which an initializing operation is performed on an initialization target memory by the system on-chip of FIG. 5.

FIG. 7 is a flowchart illustrating an example in which a memory controller included in the system on-chip of FIG. 5 operates. FIG. 8 is a flowchart illustrating an example in which a central processing unit included in the system on-chip of FIG. 5 operates. FIG. 9 is a diagram illustrating an example in which an initializing operation is performed on an initialization target memory by the system on-chip of FIG. 5.

Referring to FIGS. 7 through 9, it is illustrated that the memory controller 131 interacts with the central processing unit 110(1) through 110(n) to perform the initializing operation on the initialization target memories 132(1) through 132(k). As for operations of the memory controller 131, the memory controller 131 may receive the initialization information indicating the initialization address range AR and the initialization value VAL from the central processing unit 110(1) through 110(n) (S110) and then may determine the local initialization address ranges SAR(1) through SAR(k) of the initialization target memories 132(1) through 132(k) (i.e., indicated as DA) based on the initialization information indicating the initialization address range AR and the initialization value VAL (S120). Subsequently, the memory controller 131 may initialize the local initialization address ranges SAR(1) through SAR(k) of the initialization target memories 132(1) through 132(k) by transmitting the initialization data IDA to the initialization target memories 132(1) through 132(k) (S130). Here, when the local initialization address ranges SAR(1) through SAR(k) of the initialization target memories 132(1) through 132(k) are all written with the initialization value VAL (i.e., indicated as DB and DC), the initialization target memories 132(1) through 132(k) may transmit the local initialization completion signals CS(1) through CS(k) to the memory controller 131, respectively. Subsequently, when the memory controller 131 receives all local initialization completion signals CS(1) through CS(k) from the initialization target memories 132(1) through 132(k), the memory controller 131 may transmit the initialization completion signal FCS to the central processing unit 110(1) through 110(n) (S140). That is, the memory controller 131 may transmit the initialization completion signal FCS to the central processing unit 110(1) through 110(n) after checking whether the local initialization address ranges SAR(1) through SAR(k) of the initialization target memories 132(1) through 132(k) are all written with the initialization value VAL (i.e., indicated as DD). As for operations of the central processing unit 110(1) through 110(n), the central processing unit 110(1) through 110(n) may transmit the initialization information indicating the initialization address range AR and the initialization value VAL to the memory controller 131 (S210). Here, the central processing unit 110(1) through 110(n) may not interact with the random access memory device 130 until the initialization address range AR of the random access memory device 130 is completely written with the initialization value VAL (i.e., the initializing operation is completed). Thus, until the initialization address range AR of the random access memory device 130 is completely written with the initialization value VAL after the initialization information indicating the initialization address range AR and the initialization value VAL is transmitted from the central processing unit 110(1) through 110(n) to the memory controller 131, bus occupation for performing the initializing operation may not occur between the central processing unit 110(1) through 110(n) and the random access memory device 130. Subsequently, when the central processing unit 110(1) through 110(n) receives the initialization completion signal FCS from the memory controller 131 (S220), the central processing unit 110(1) through 110(n) may initialize its internal cache (i.e., indicated as DE) (S230) because data stored in the internal cache of the central processing unit 110(1) through 110(n) is no longer valid.

Figure 10:
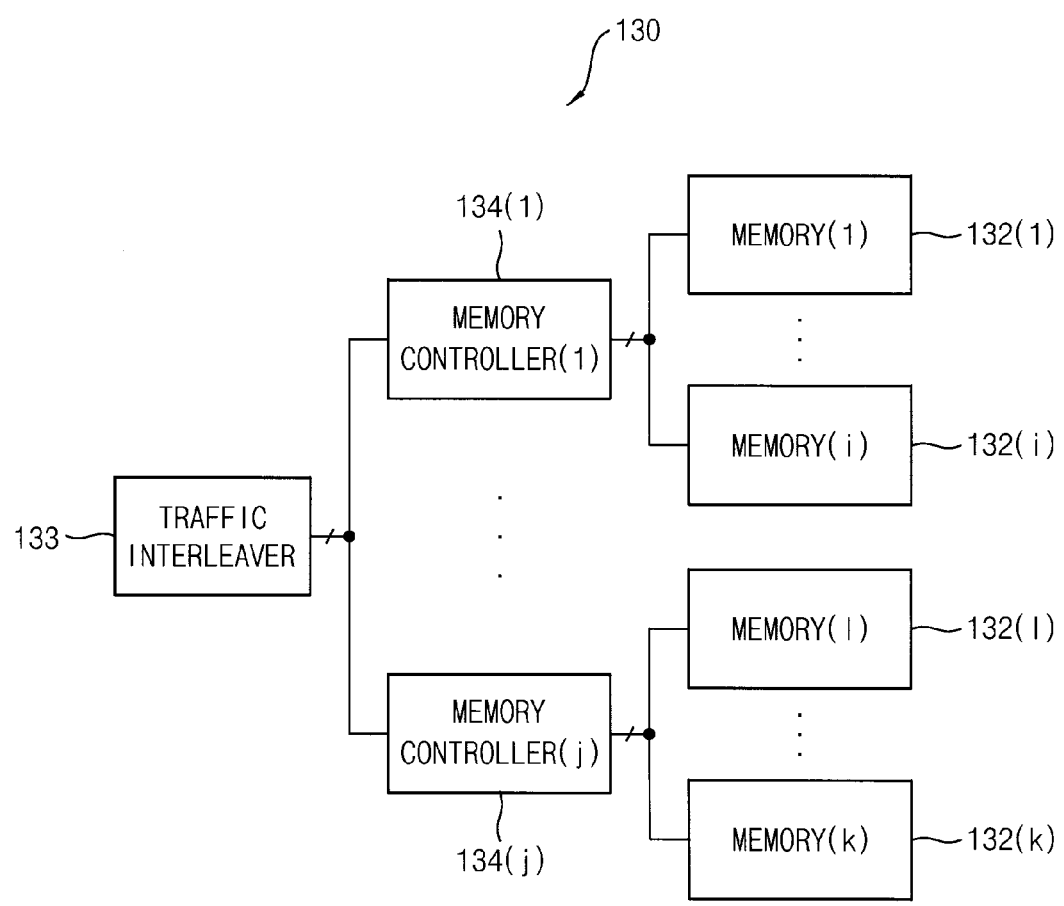
FIG. 10 is a block diagram illustrating a random access memory device according to example embodiments.
Figure 11:
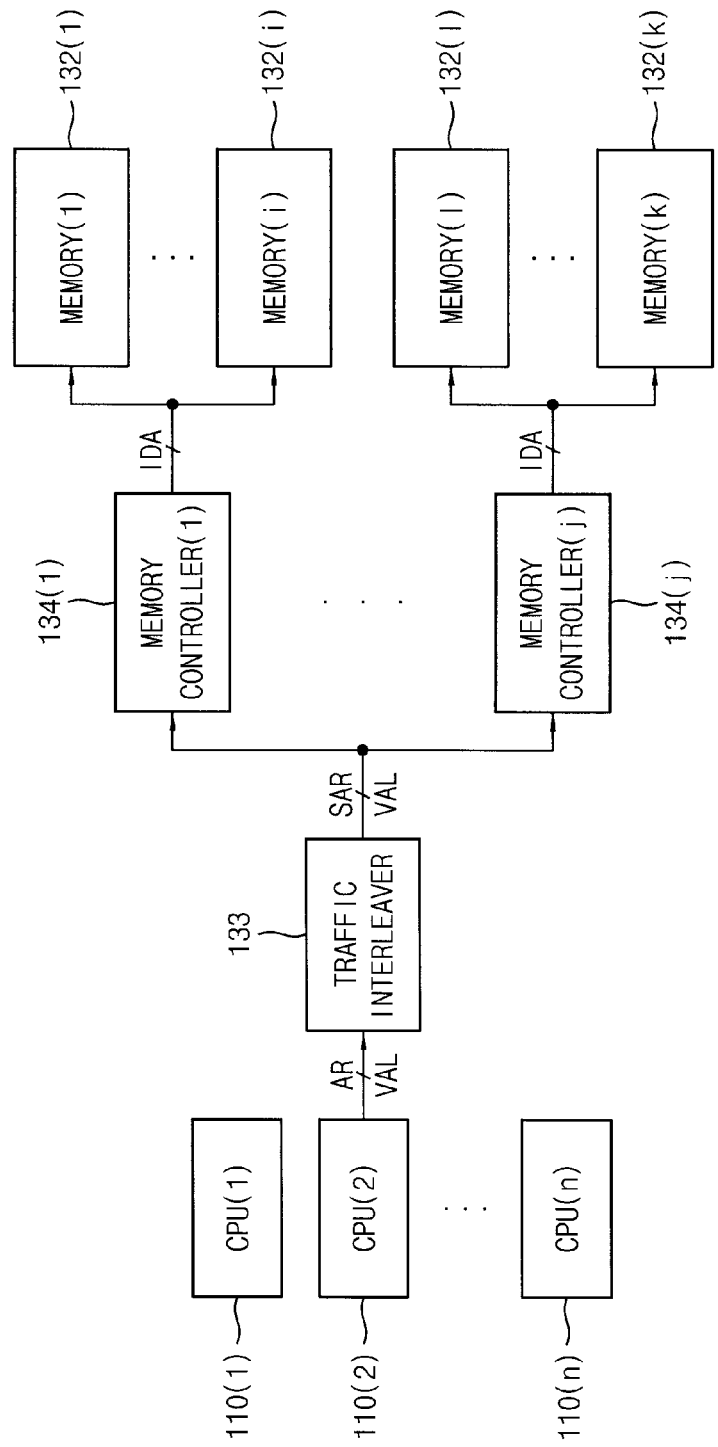
FIG. 11 is a block diagram illustrating a system on-chip according to example embodiments.
Figure 12:
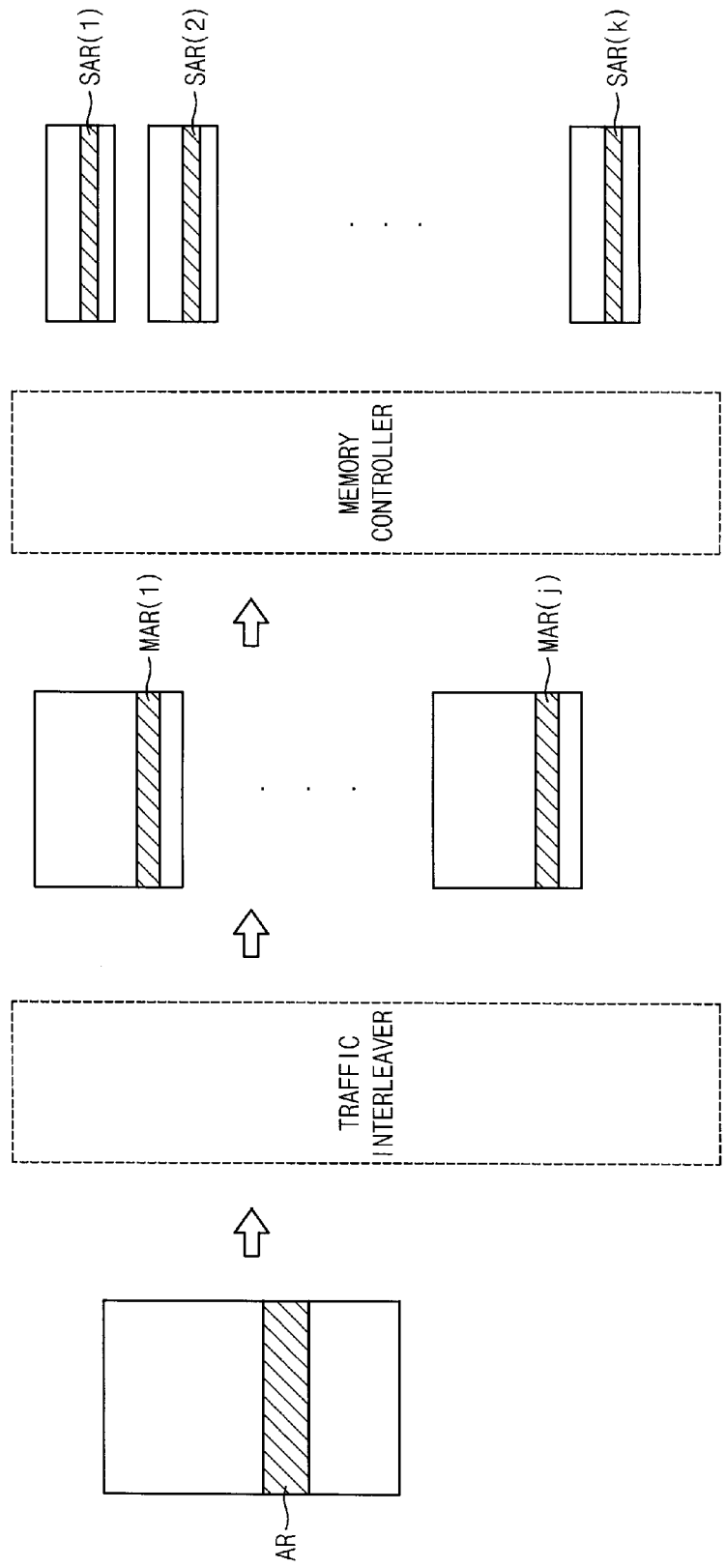
FIG. 12 is a diagram for describing an initializing operation that is performed on an initialization target memory by the system on-chip of FIG. 11.

FIG. 10 is a block diagram illustrating a random access memory device according to example embodiments. FIG. 11 is a block diagram illustrating a system on-chip according to example embodiments. FIG. 12 is a diagram for describing an initializing operation that is performed on an initialization target memory by the system on-chip of FIG. 11.

Referring to FIGS. 10 through 12, the random access memory device 130 may include a traffic interleaver 133, a plurality of memory controllers 134(1) through 134(j), where j is an integer greater than or equal to 2, and a plurality of random access memories 132(1) through 132(k), where k is an integer greater than or equal to 2. Here, the traffic interleaver 133 and the memory controllers 134(1) through 134(j) may be implemented with the central processing unit 110(1) through 110(n) of the electronic device as the system on-chip. As illustrated in FIG. 11, the random access memory device 130 may interact with the central processing unit 110(1) through 110(n). Although it is illustrated in FIG. 11 that the random access memory device 130 interacts with the central processing unit 110(2), the central processing unit 110(1) through 110(n) which the random access memory device 130 interacts with may be changed in real-time.

The random access memories 132(1) through 132(k) may store data for operations of the electronic device. Here, the random access memories 132(1) through 132(k) may be grouped into a plurality of random access memory groups, and the random access memory groups may be connected to the memory controllers 134(1) through 134(j), respectively. For example, the random access memories 132(1) through 132(i) may constitute one random access memory group to be connected to the memory controller 134(1), and the random access memories 132(1) through 132(k) may constitute one random access memory group to be connected to the memory controller 134(j). In this case, since j memory controllers 134(1) through 134(j) exist in the random access memory device 130, j random access memory groups connected to the j memory controllers 134(1) through 134(j) may exist. When a software component, etc., that drives the electronic device requires initializing a specific address range (i.e., an initialization address range AR) of the random access memory device 130 with an initialization value VAL, the local initialization address ranges SAR(1) through SAR(k) of the random access memories 132(1) through 132(k) corresponding to the initialization address range AR of the random access memory device 130 may be initialized. That is, as illustrated in FIG. 12, the physical addresses of the random access memory device 130 recognized by the central processing unit 110(1) through 110(n) may be dispersedly mapped to the physical addresses of the random access memories 132(1) through 132(k) included in the random access memory device 130. Thus, the initialization address range AR of the random access memory device 130 recognized by the central processing unit 110(1) through 110(n) may be dispersedly mapped to the local initialization address ranges SAR(1) through SAR(k) of the random access memories 132(1) through 132(k) included in the random access memory device 130. Therefore, when initializing the initialization address range AR of the random access memory device 130 with the initialization value VAL is required, the local initialization address ranges SAR(1) through SAR(k) of the random access memories 132(1) through 132(k) corresponding to the initialization address range AR of the random access memory device 130 may be initialized. In an example embodiment, the random access memories 132(1) through 132(k) may be dynamic random access memories. However, the random access memories 132(1) through 132(k) are not limited thereto. For example, the random access memories 132(1) through 132(k) may be static random access memories, mobile dynamic random access memories, etc.

The memory controllers 134(1) through 134(j) may control corresponding random access memory groups, respectively. Here, the memory controllers 134(1) through 134(j) may receive the local initialization information indicating the local initialization address ranges SAR(1) through SAR(k) of the initialization target memories 132(1) through 132(k) and the initialization value VAL from the traffic interleaver 133 and may transmit, by a predetermined unit, the initialization data IDA including the initialization values VAL to the initialization target memories 132(1) through 132(k) based on the local initialization information. In this way, the memory controllers 134(1) through 134(j) may initialize the local initialization address ranges SAR(1) through SAR(k) of the initialization target memories 132(1) through 132(k). Here, the initialization data IDA may be binary data, and the initialization value VAL may be a binary digit '0' or a binary digit '1'. In addition, the memory controllers 134(1) through 134(j) may provide commands for writing the initialization data IDA into the local initialization address ranges SAR(1) through SAR(k) when transmitting the initialization data IDA to the initialization target memories 132(1) through 132(k). In an example embodiment, the predetermined unit by which the initialization data IDA is transmitted may be set to be smaller than each of the local initialization address ranges SAR(1) through SAR(k) of the initialization target memories 132(1) through 132(k). In this case, the initialization data IDA may be repetitively transmitted to each of the initialization target memories 132(1) through 132(k) because the local initialization address ranges SAR(1) through SAR(k) of the initialization target memories 132(1) through 132(k) cannot be completely initialized with the initialization value VAL when the initialization data IDA is transmitted only once. For example, the predetermined unit may be a byte unit, a word unit, etc. In another example embodiment, the predetermined unit by which the initialization data IDA is transmitted may be set to be equal to each of the local initialization address ranges SAR(1) through SAR(k) of the initialization target memories 132(1) through 132(k). In this case, the initialization data IDA may be transmitted to each of the initialization target memories 132(1) through 132(k) once because each of the local initialization address ranges SAR(1) through SAR(k) of the initialization target memories 132(1) through 132(k) can be completely written with the initialization value VAL when the initialization data IDA is transmitted only once. For example, the predetermined unit may be not fixed for the initialization target memories 132(1) through 132(k). In other words, the predetermined unit may be changed according to the local initialization address ranges SAR(1) through SAR(k) for the initialization target memories 132(1) through 132(k).

The traffic interleaver 133 may receive the initialization information indicating the initialization address range AR and the initialization value VAL from the central processing unit 110(1) through 110(n), may determine the initialization target memories 132(1) through 132(k) and the local initialization address ranges SAR(1) through SAR(k) based on the initialization information indicating the initialization address range AR and the initialization value VAL, may generate the local initialization information indicating the local initialization address ranges SAR(1) through SAR(k) of the initialization target memories 132(1) through 132(k) and the initialization value VAL, and then may provide the memory controllers 134(1) through 134(j) with the local initialization information indicating the local initialization address ranges SAR(1) through SAR(k) of the initialization target memories 132(1) through 132(k) and the initialization value VAL. Here, the traffic interleaver 133 may classify (or, sort) the local initialization address ranges SAR(1) through SAR(k) managed by the memory controllers 134(1) through 134(j) (i.e., indicated as MAR(1) through MAR(j)) and may provide the local initialization information to the memory controllers 134(1) through 134(j). In example embodiments, when the local initialization address ranges SAR(1) through SAR(k) of the initialization target memories 132(1) through 132(k) are initialized (i.e., the local initialization address ranges SAR(1) through SAR(k) of the initialization target memories 132(1) through 132(k) are written with the initialization value VAL), each of the initialization target memories 132(1) through 132(k) may transmit a local initialization completion signal to the traffic interleaver 133 via each of the memory controllers 134(1) through 134(j). For example, the initialization target memory 132(1) may transmit the local initialization completion signal to the traffic interleaver 133 via the memory controller 134(1) when the local initialization address range SAR(1) of the initialization target memory 132(1) is initialized, the initialization target memory 132(2) may transmit the local initialization completion signal to the traffic interleaver 133 via the memory controller 134(2) when the local initialization address range SAR(2) of the initialization target memory 132(2) is initialized, and the initialization target memory 132(k) may transmit the local initialization completion signal to the traffic interleaver 133 via the memory controller 134(j) when the local initialization address range SAR(k) of the initialization target memory 132(k) is initialized. Subsequently, when the traffic interleaver 133 receives all local initialization completion signals from the initialization target memories 132(1) through 132(k) via the memory controllers 134(1) through 134(j), the traffic interleaver 133 may transmit an initialization completion signal to the central processing unit 110(1) through 110(n). For example, if k initialization target memories 132(1) through 132(k) exist, the traffic interleaver 133 may transmit the initialization completion signal to the central processing unit 110(1) through 110(n) after receiving all local initialization completion signals from the k initialization target memories 132(1) through 132(k) via the memory controllers 134(1) through 134(j). In example embodiments, when the traffic interleaver 133 receives the initialization information indicating the initialization address range AR and the initialization value VAL from the central processing unit 110(1) through 110(n), the traffic interleaver 133 may stop (or, postpone) processing an access request of an external device for the initialization address range AR. For example, the external device may be the function device 120(1) through 120(m) and/or another central processing unit 110(1) through 110(n) that does not interact with the random access memory device 130. Subsequently, when the traffic interleaver 133 receives all local initialization completion signals from the initialization target memories 132(1) through 132(k) via the memory controllers 134(1) through 134(j) (i.e., the local initialization address ranges SAR(1) through SAR(k) of the initialization target memories 132(1) through 132(k) are all initialized), the traffic interleaver 133 may begin (or, restart) processing the access request of the function device 120(1) through 120(m) and/or the access request of another central processing unit 110(1) through 110(n) that does not interact with the random access memory device 130 for the initialization address range AR. In brief, while the initializing operation is performed in the random access memory device 130, the function device 120(1) through 120(m) and/or another central processing unit 110(1) through 110(n) that does not interact with the random access memory device 130 may not be allowed to access the initialization address range AR.

As described above, the traffic interleaver 133 may initialize the local initialization address ranges SAR(1) through SAR(k) of the initialization target memories 132(1) through 132(k) by receiving the initialization information indicating the initialization address range AR and the initialization value VAL from the central processing unit 110(1) through 110(n), by determining the local initialization address ranges SAR(1) through SAR(k) of the initialization target memories 132(1) through 132(k) based on the initialization information indicating the initialization address range AR and the initialization value VAL, and by transmitting the initialization data IDA including the initialization values VAL to the initialization target memories 132(1) through 132(k) by a predetermined unit. In addition, the traffic interleaver 133 may transmit the initialization completion signal to the central processing unit 110(1) through 110(n) when the local initialization address ranges SAR(1) through SAR(k) of the initialization target memories 132(1) through 132(k) are all initialized. In this way, the traffic interleaver 133 may perform the initializing operation on the initialization target memories 132(1) through 132(k). As a result, the system on-chip including the central processing unit 110(1) through 110(n), the traffic interleaver 133, and the memory controllers 134(1) through 134(j) may prevent the bus traffic and/or the load of the central processing unit 110(1) through 110(n) from being unnecessarily increased when performing the initializing operation on the initialization target memories 132(1) through 132(k). In other words, since the traffic interleaver 133 leadingly performs an initializing operation (e.g., a function such as memset( ), etc.,) that a conventional electronic device frequently performs to repetitively write the same value into a specific address range, the system on-chip including the central processing unit 110(1) through 110(n), the traffic interleaver 133, and the memory controllers 134(1) through 134(j) may reduce the bus traffic and/or the load of the central processing unit 110(1) through 110(n) and thus may increase a bus bandwidth that can be used by the function device 120(1) through 120(m) and the central processing unit 110(1) through 110(n). As a result, the electronic device including the random access memory device 130 may achieve improved reliability, improved performance, and consumption power reduction.

Figure 13:
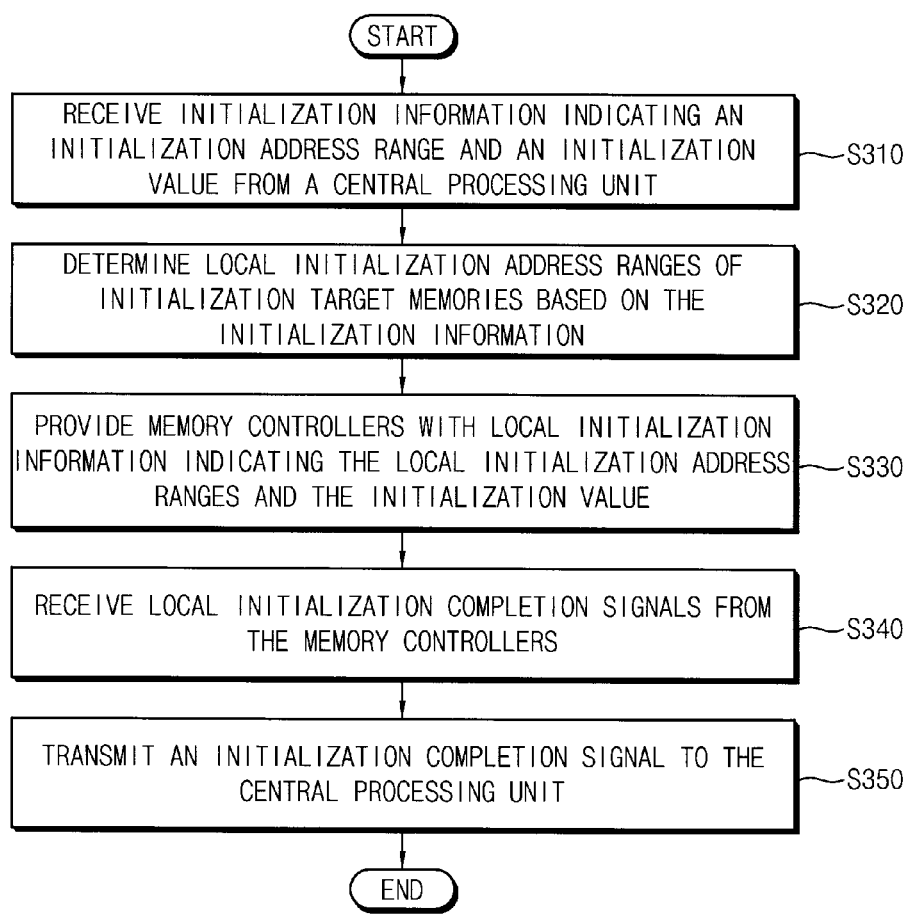
FIG. 13 is a flowchart illustrating an example in which a memory controller included in the system on-chip of FIG. 11 operates.
Figure 14:
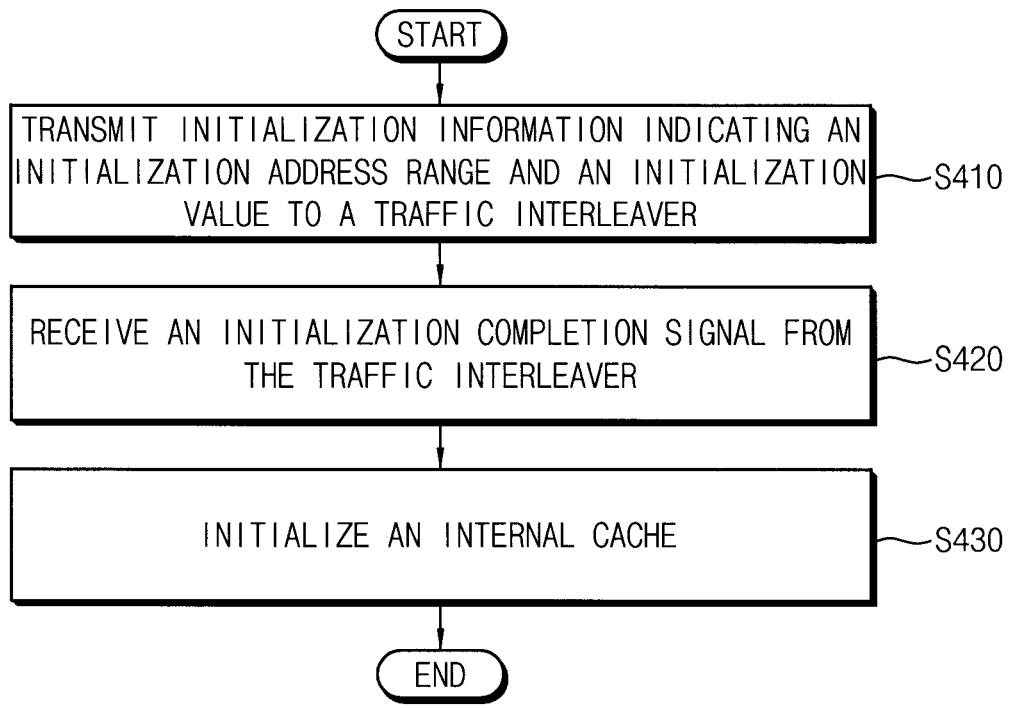
FIG. 14 is a flowchart illustrating an example in which a central processing unit included in the system on-chip of FIG. 11 operates.
Figure 15:
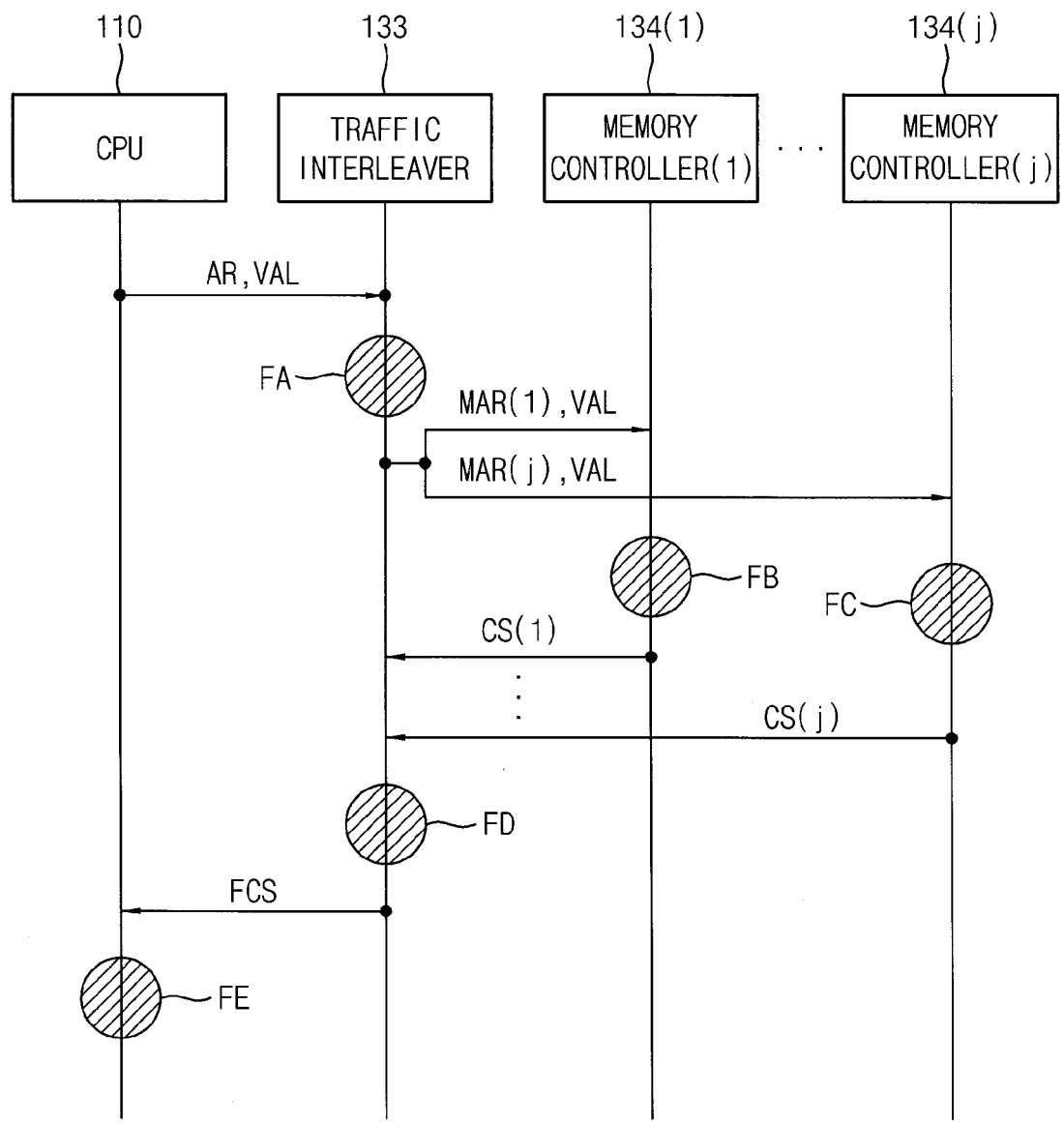
FIG. 15 is a diagram illustrating an example in which an initializing operation is performed on an initialization target memory by the system on-chip of FIG. 11.

FIG. 13 is a flowchart illustrating an example in which a memory controller included in the system on-chip of FIG. 11 operates. FIG. 14 is a flowchart illustrating an example in which a central processing unit included in the system on-chip of FIG. 11 operates. FIG. 15 is a diagram illustrating an example in which an initializing operation is performed on an initialization target memory by the system on-chip of FIG. 11.

Referring to FIGS. 13 through 15, it is illustrated that the traffic interleaver 133 interacts with the central processing unit 110(1) through 110(n) to perform the initializing operation on the initialization target memories 132(1) through 132(k). As for operations of the traffic interleaver 133, the traffic interleaver 133 may receive the initialization information indicating the initialization address range AR and the initialization value VAL from the central processing unit 110(1) through 110(n) (S310) and then may determine the local initialization address ranges SAR(1) through SAR(k) of the initialization target memories 132(1) through 132(k) (i.e., indicated as FA) based on the initialization information indicating the initialization address range AR and the initialization value VAL (S320). Subsequently, the traffic interleaver 133 may provide the memory controllers 134(1) through 134(j) that control the initialization target memories 132(1) through 132(k) with the local initialization information indicating the local initialization address ranges SAR(1) through SAR(k) and the initialization value VAL (S330). Here, the traffic interleaver 133 may classify (or, sort) the local initialization address ranges SAR(1) through SAR(k) managed by the memory controllers 134(1) through 134(j) (i.e., indicated as MAR(1) through MAR(j)) and may provide the local initialization information to the memory controllers 134(1) through 134(j). Thus, the memory controllers 134(1) through 134(j) may initialize the local initialization address ranges SAR(1) through SAR(k) of the initialization target memories 132(1) through 132(k) (i.e., indicated as FB, FC) by transmitting the initialization data IDA to the initialization target memories 132(1) through 132(k) based on the local initialization information indicating the local initialization address ranges SAR(1) through SAR(k) and the initialization value VAL (S330). Here, when the local initialization address ranges SAR(1) through SAR(k) of the initialization target memories 132(1) through 132(k) are all written with the initialization value VAL (i.e., indicated as FB and FC), the memory controllers 134(1) through 134(j) may transmit the local initialization completion signals CS(1) through CS(k) to the traffic interleaver 133. That is, the traffic interleaver 133 may receive the local initialization completion signals CS(1) through CS(k) from the memory controllers 134(1) through 134(j) (S340) and then may transmit the initialization completion signal FCS to the central processing unit 110(1) through 110(n) (S350). The traffic interleaver 133 may transmit the initialization completion signal FCS to the central processing unit 110(1) through 110(n) after checking whether the local initialization address ranges SAR(1) through SAR(k) of the initialization target memories 132(1) through 132(k) are all written with the initialization value VAL (i.e., indicated as FD). As for operations of the central processing unit 110(1) through 110(n), the central processing unit 110(1) through 110(n) may transmit the initialization information indicating the initialization address range AR and the initialization value VAL to the traffic interleaver 133 (S410). Here, the central processing unit 110(1) through 110(n) may not interact with the random access memory device 130 until the initialization address range AR of the random access memory device 130 is completely written with the initialization value VAL (i.e., the initializing operation is completed). Thus, until the initialization address range AR of the random access memory device 130 is completely written with the initialization value VAL after the initialization information indicating the initialization address range AR and the initialization value VAL is transmitted from the central processing unit 110(1) through 110(n) to the traffic interleaver 133, bus occupation for performing the initializing operation may not occur between the central processing unit 110(1) through 110(n) and the random access memory device 130. Subsequently, when the central processing unit 110(1) through 110(n) receives the initialization completion signal FCS from the traffic interleaver 133 (S420), the central processing unit 110(1) through 110(n) may initialize its internal cache (i.e., indicated as FE) (S430) because data stored in the internal cache of the central processing unit 110(1) through 110(n) is no longer valid.

Figure 16:
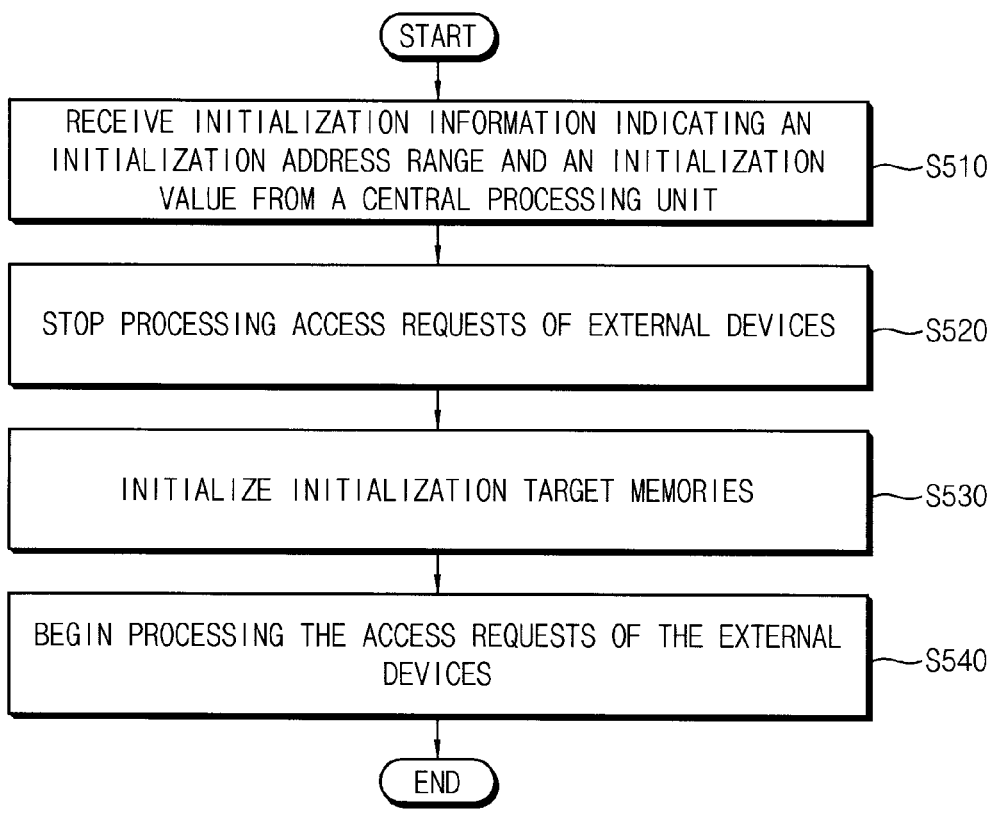
FIG. 16 is a flowchart illustrating an example in which an access request of a function device for an initialization address range is processed by the system on-chip of FIG. 11.
Figure 17:
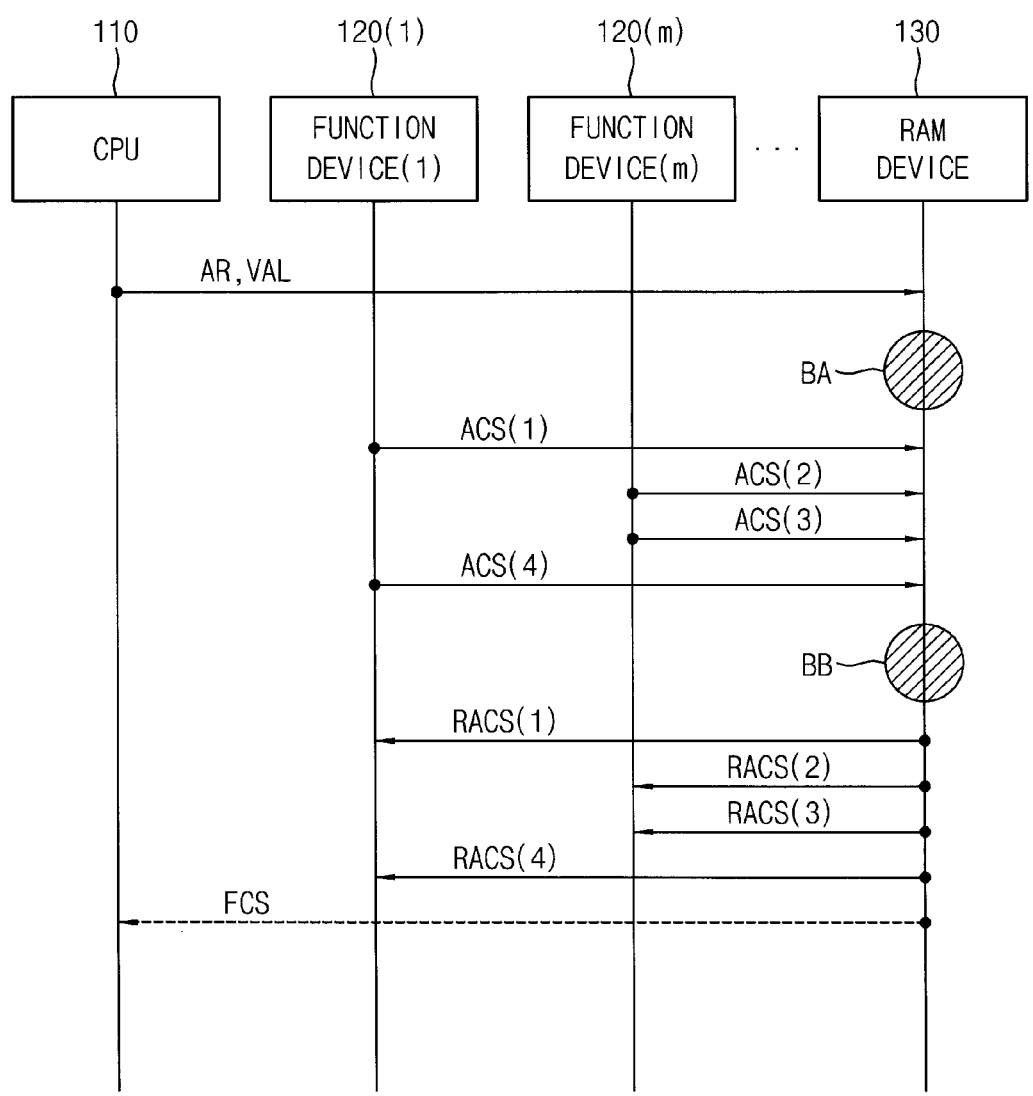
FIG. 17 is a diagram illustrating an example in which an access request of a function device for an initialization address range is processed by the system on-chip of FIG. 11.

FIG. 16 is a flowchart illustrating an example in which an access request of a function device for an initialization address range is processed by the system on-chip of FIG. 11. FIG. 17 is a diagram illustrating an example in which an access request of a function device for an initialization address range is processed by the system on-chip of FIG. 11.

Referring to FIGS. 16 and 17, while the initializing operation is performed in the random access memory device 130, the function device 120(1) through 120(m) and/or another central processing unit 110(1) through 110(n) that does not interact with the random access memory device 130 may not be allowed to access the initialization address range AR. Specifically, the random access memory device 130 may receive the initialization information indicating the initialization address range AR and the initialization value VAL from the central processing unit 110(1) through 110(n) (S510) and then may stop (or, postpone) processing access requests ACS(1) through ACS(4) of external devices (e.g., the function devices 120(1) through 120(m)) and/or access requests of another central processing units that do not interact with the random access memory device 130 for the initialization address range AR (S520). As illustrated in FIG. 17, the random access memory device 130 may decide to stop (or, postpone) processing the access requests ACS(1) through ACS(4) of the external devices for the initialization address range AR (i.e., indicated as BA). Thus, the random access memory device 130 may not transmit access request responses RACS(1) through RACS(4) to the external devices although the random access memory device 130 receives the access requests ACS(1) through ACS(4) for the initialization address range AR from the external devices. Subsequently, the random access memory device 130 may initialize the initialization target memories based on the initialization information indicating the initialization address range AR and the initialization value VAL (S530) and then may begin (or, restart) processing the access requests ACS(1) through ACS(4) of the external devices for the initialization address range AR (S540). As illustrated in FIG. 17, the random access memory device 130 may decide to begin (or, restart) processing the access requests ACS(1) through ACS(4) of the external devices for the initialization address range AR (i.e., indicated as BB). Thus, the random access memory device 130 may sequentially process the access requests ACS(1) through ACS(4) of the external devices for the initialization address range AR by transmitting the access request responses RACS(1) through RACS(4) to the external devices. Although it is illustrated in FIG. 17 that the random access memory device 130 sequentially provides the access request responses RACS(1) through RACS(4) to the external devices in the order of receiving the access requests ACS(1) through ACS(4) for the initialization address range AR from the external devices, in some example embodiments, the random access memory device 130 may provides the access request responses RACS(1) through RACS(4) to the external devices regardless of the order (or, sequence) of receiving the access requests ACS(1) through ACS(4) for the initialization address range AR from the external devices. In example embodiments, the random access memory device 130 may allow the central processing unit 110(1) through 110(n) to initialize its internal cache by transmitting the initialization completion signal FCS to the central processing unit 110(1) through 110(n) because data stored in the internal cache of the central processing unit 110(1) through 110(n) is no longer valid when the initialization target memories are completely initialized.

Figure 18:
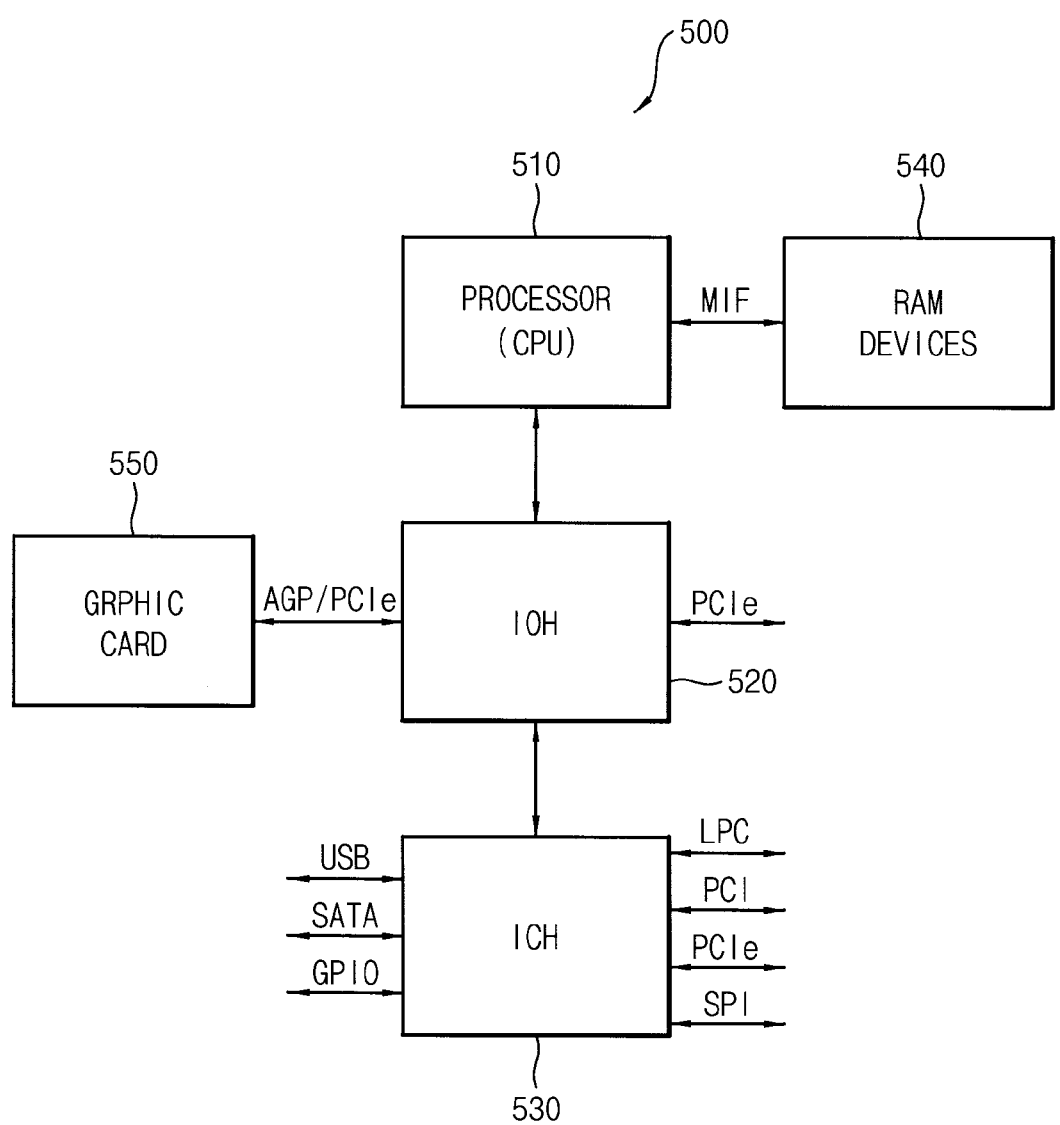
FIG. 18 is a block diagram illustrating a computing system according to example embodiments.

FIG. 18 is a block diagram illustrating a computing system according to example embodiments.

Referring to FIG. 18, the computing system 500 may include a processor 510, an input/output (I/O) hub 520, an I/O controller hub 530, random access memory devices 540, and a graphics card 550. In some example embodiments, the computing system 500 may be an electronic device such as a personal computer, a server computer, a workstation, a laptop, etc.

The processor 510 may perform various computing functions. For example, the processor 510 may be a microprocessor, a central processing unit, application processor, etc. In some example embodiments, the processor 510 may include one processor core or a plurality of processor cores. For example, the processor 510 may be a dual-core processor, a quad-core processor, a hexa-core processor, etc. Although one processor 510 is illustrated in FIG. 18, the computing system 500 may include a plurality of processors 510. The processor 510 may include an internal cache. In example embodiments, the processor 510 may further include an external cache. The processor 510 may interact with the random access memory device 540 by generating a memory control signal. The random access memory device 540 may include at least one memory controller. In some example embodiments, the memory controller may be implemented within the processor 510. In this case, the memory controller included in the processor 510 may be referred to as an integrated memory controller (IMC). In some example embodiments, the memory controller may be located within the I/O hub 520. In this case, the I/O hub 520 including the memory controller may be referred to as a memory controller hub (MCH). The random access memory device 540 may receive initialization information indicating an initialization address range and an initialization value from the processor 510, may determine at least one local initialization address range of at least one initialization target memory based on the initialization information, and may initialize the local initialization address range of the initialization target memory by transmitting initialization data including the initialization values (e.g., a binary digit '0' or a binary digit '1') to the initialization target memory by a predetermined unit. In addition, the random access memory device 540 may transmit an initialization completion signal to the processor when the local initialization address range of the initialization target memory is initialized. In this way, the random access memory device 540 may perform an initializing operation on the initialization target memory. As a result, the random access memory device 540 may prevent bus traffic and/or a load of the processor 510 from being unnecessarily increased when performing the initializing operation on the initialization target memory. Thus, even when the initializing operation is performed on the initialization target memory in the random access memory device 540, the computing system 500 may enable an interaction between the processor 510 and a function device and may secure a sufficient bus bandwidth that can be used by the processor 510 and the function device. For this operation, the random access memory device 540 may include a memory controller or a traffic interleaver that leadingly performs the initializing operation. In addition, the memory controller and/or the traffic interleaver of the random access memory device 540 may be implemented with the processor 510 (i.e., a central processing unit) as a system on-chip. Since these are described above, duplicated description will not be repeated.

The I/O hub 520 may manage data transfer operations between the processor 510 and devices such as the graphics card 550. The I/O hub 520 may be coupled to the processor 510 based on various interfaces. For example, the interface between the processor 510 and the I/O hub 520 may be a front side bus (FSB), a system bus, a HyperTransport, a lightening data transport (LDT), a QuickPath interconnect (QPI), a common system interface (CSI), etc. In addition, the I/O hub 520 may provide various interfaces with the devices. For example, the I/O hub 520 may provide an accelerated graphics port (AGP) interface, a peripheral component interface-express (PCIe), a communications streaming architecture (CSA) interface, etc. Although one I/O hub 520 is illustrated in FIG. 18, the computing system 500 may include a plurality of I/O hubs. The graphics card 550 may be coupled to the I/O hub 520 via AGP or PCIe for controlling a display device to display an image. The graphics card 550 may include an internal processor for processing image data. In some example embodiments, the I/O hub 520 may include an internal graphics device instead of the graphics card 550. Here, the graphics device included in the I/O hub 520 may be referred to as integrated graphics. The I/O controller hub 530 may perform data buffering and interface arbitration operations to efficiently operate various system interfaces. The I/O controller hub 530 may be coupled to the I/O hub 520 via an internal bus such as a direct media interface (DMI), a hub interface, an enterprise Southbridge interface (ESI), PCIe, etc. The I/O controller hub 530 may interface with peripheral devices. For example, the I/O controller hub 530 may provide a universal serial bus (USB) port, a serial advanced technology attachment (SATA) port, a general purpose input/output (GPIO), a low pin count (LPC) bus, a serial peripheral interface (SPI), PCI, PCIe, etc.

The present disclosure may be applied to an electronic device. For example, the present disclosure may be applied to a cellular phone, a video phone, a smart phone, a smart pad, a tablet PC, a personal digital assistants (PDA), a portable multimedia player (PMP), a digital camera, a camcorder, a computer, a laptop, a digital television, an MP3 player, a portable game console, a car navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A system on-chip comprising:
a central processing unit;
a traffic interleaver that:
   receives initialization information indicating an initialization address range and an initialization value from the central processing unit,
   determines an initialization target memory and a local initialization address range of the initialization target memory based on the initialization information, and
   generates local initialization information indicating the local initialization address range and the initialization value of the initialization target memory; and
a plurality of memory controllers that:
   control a plurality of random access memory groups each including a random access memory,
   receive the local initialization information from the traffic interleaver, and
   transmit initialization data including the initialization value to the initialization target memory based on the local initialization information to initialize the local initialization address range of the initialization target memory, wherein:
each of the memory controllers transmits the initialization data to the initialization target memory in a single transmission,
the traffic interleaver transmits an initialization completion signal to the central processing unit when the traffic interleaver receives a local initialization completion signal from the initialization target memory via the memory controllers as the local initialization address range of the initialization target memory is initialized, and
the central processing unit initializes an internal cache when the central processing unit receives the initialization completion signal from the traffic interleaver.

2. The system on-chip of claim 1, wherein the traffic interleaver stops processing an access request of an external device for the initialization address range when the traffic interleaver receives the initialization information from the central processing unit.

3. The system on-chip of claim 2, wherein the traffic interleaver begins processing the access request when the traffic interleaver receives a local initialization completion signal from the initialization target memory via the memory controllers as the local initialization address range of the initialization target memory is initialized.

* * * * *